United States Patent

Ueda et al.

(10) Patent No.: US 6,280,895 B1
(45) Date of Patent: Aug. 28, 2001

(54) LIGHT-RECEIVING MEMBER WITH OUTER LAYER MADE BY ALTERNATIVELY FORMING AND ETCHING

(75) Inventors: Shigenori Ueda; Junichiro Hashizume, both of Nara; Makoto Aoki; Shinji Tsuchida, both of Tsuzuki-gun, all of (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 09/361,804

(22) Filed: Jul. 27, 1999

Related U.S. Application Data

(62) Division of application No. 08/637,188, filed on Apr. 24, 1996, now Pat. No. 5,958,644.

(30) Foreign Application Priority Data

Apr. 26, 1995 (JP) .................................... 7-102026
Nov. 30, 1995 (JP) .................................... 7-335951
Apr. 18, 1996 (JP) .................................... 8-096558

(51) Int. Cl.$^7$ .................................................. G03G 15/04
(52) U.S. Cl. ........................................... 430/66; 430/57.1
(58) Field of Search ........................................ 430/66, 57

(56) References Cited

U.S. PATENT DOCUMENTS

| | | | |
|---|---|---|---|
| 4,265,991 | 5/1981 | Hirai et al. | 430/64 |
| 4,386,577 | 6/1983 | Hosono et al. | 118/657 |
| 4,664,999 | 5/1987 | Kakinuma et al. | 430/67 |
| 5,358,811 | 10/1994 | Yamazaki et al. | 430/57 |
| 5,455,138 | 10/1995 | Okamura et al. | 430/128 |
| 5,514,506 | 5/1996 | Takai et al. | 430/57 |
| 5,561,021 | 10/1996 | Yamazaki et al. | 430/57 |
| 5,670,286 | 9/1997 | Takei et al. | 430/57 |
| 5,731,116 * | 3/1998 | Matsuo et al. | 430/56 |

FOREIGN PATENT DOCUMENTS

| | | |
|---|---|---|
| 0 454 456 | 10/1991 | (EP) . |
| 0 43 037 | 4/1979 | (JP) . |
| 1 44 865 | 8/1983 | (JP) . |
| 0 07 451 | 1/1985 | (JP) . |

OTHER PUBLICATIONS

Patent Abstracts of Japan, 12, No. 468 (P–797) Dec. 1988 (JP 63–187257).
Patent Abstracts of Japan, 13, No. 505 (P–959) Nov. 1989 (JP 01–204056).
Patent Abstracts of Japan, 12, No. 092 (C–483) Mar. 1988 (JP 62–224673).
Patent Abstracts of Japan, 12, No. 279 (C–517) Aug. 1988 (JP 63–05777).
Patent Abstracts of Japan, 13, No. 021 (C–560) Jan. 1989 (JP 63–223783).
Curtins, et al., "Influence of Plasma . . . Deposition"; Plasma Chem. and Plasma Processing, vol. 7, No. 3, 1987 (pp 267–273).

* cited by examiner

*Primary Examiner*—Laura Weiner
(74) *Attorney, Agent, or Firm*—Fitzpatrick, Cella, Harper & Scinto

(57) ABSTRACT

In a reactor capable of reducing an internal pressure thereof, a non-single-crystalline material layer containing at least one kind of carbon atoms, hydrogen atoms or nitrogen atoms is formed and etched on a non-single-crystalline photoconductive layer mainly composed of silicon atoms, formed on a substrate, under application of a high-frequency power of 50 MHz to 450 MHz, and the formation and the etching are alternately repeated plural times to form a surface layer.

A light-receiving member having such a surface layer does not damage cleaning performance over a long period of time, hardly allows adhesion of corona discharge products, and can be free from faint images, smeared images and uneven image density even if no heating means for the drum is provided.

5 Claims, 6 Drawing Sheets

LIGHT-RECEIVING MEMBER WITH OUTER LAYER MADE BY ALTERNATIVELY FORMING AND ETCHING

This application is a Division of Ser. No. 08/637,188 filed Apr. 24, 1996 U.S. Pat. No. 5,958,644.

BACKGROUND OF THE INVENTION

1. Field of the Invention

This invention relates to a process for producing a light-receiving member, a light-receiving member produced by the method, an electrophotographic apparatus having the light-receiving member, and an electrophotographic method using the light-receiving member. More particularly, it relates to a process for producing a light-receiving member that has a superior cleaning performance and can obtain high-quality images free of faint images and smeared images in any environment, an electrophotographic apparatus having the light-receiving member, and an electrographic method using the light-receiving member.

2. Related Background Art

As materials for light-receiving members to be used in electrophotographic photosensitive members, inorganic materials such as selenium, cadmium sulfide, zinc oxide and amorphous silicon (hereinafter referred to as "a-Si") and organic materials are proposed in variety. Of these, non-single-crystalline deposited films containing silicon atoms as a main component, typified by a-Si, have been proposed as materials for photosensitive members having a high performance and a high durability and free from environmental pollution, as exemplified by amorphous deposited films of a-Si containing hydrogen and/or a halogen such as fluorine or chlorine (e.g., hydrogen or halogen compensates dangling bonds). Some of these have been put into practical use.

U.S. Pat. No. 4,265,991 discloses a technique concerning an electrophotographic photosensitive member comprising a photoconductive layer mainly formed of a-Si.

Such a-Si type photosensitive members typified by a-Si have advantages that they have a high surface hardness, exhibit a high sensitivity to long-wavelength light of semiconductor lasers (770 nm to 800 nm) or the like and also are almost free from deterioration due to repeated use. Hence, they are put into wide use in photosensitive members for electrophotographic apparatus as exemplified by high-speed copying machines and LBPs (laser beam printers).

As processes for forming such silicon type non-single-crystalline deposited films, a number of processes are known in the art, as exemplified by sputtering, a process in which a material gas is decomposed by heat (thermal CVD), a process in which a material gas is decomposed by light (optical CVD), and a process in which a material gas is decomposed by plasma (plasma-assisted CVD). In particular, plasma-assisted CVD, i.e., a process in which a material gas is decomposed by glow discharge or the like generated by utilizing a direct current, a high-frequency (RF or VHF) or a microwave to form a deposited film on any desired substrate such as glass, quartz, heat-resistant synthetic resin film, stainless steel or aluminum is being widely put into practical use not only in the process for forming amorphous-silicon deposited films for use in electrophotography but also in processes for forming deposited films for other uses. Apparatuses therefor are also proposed in a wide variety.

In recent years, taking into account its application in electrophotographic photosensitive members, it is strongly sought to improve film quality and processability, and various measures are studied to do so.

In particular, a plasma-assisted process making use of high-frequency power is widely used because of its various advantages such that it has a high discharge stability and can be used to form insulating materials such as oxide films and nitride films.

Incidentally, in recent years, plasma-assisted CVD carried out at a high frequency of 20 MHz or above using a parallel flat plate type plasma-assisted .CVD apparatus, as reported in Plasma Chemistry and Plasma Processing, Vol. 7, No. 3 (1987), pp.267–273, has attracted notice, which shows a possibility of improving the deposition rate without a lowering of the performance of deposited films by making the discharge frequency higher than 13.56 MHz conventionally used. Making the discharge frequency higher in this way is also reported in respect of sputtering, and has been widely studied in recent years.

Now, as charging and charge-eliminating means of conventional light-receiving members of various types including a-Si light-receiving members, a corona assembly (corotron, scorotron) is used which comprise a wire electrode (e.g., a metal wire such as a tungsten wire of 50 to 100 $\mu$m diameter, coated with gold) and a shielding plate in almost all cases. More specifically, corona electric currents generated by applying a high voltage (about 4 to 8 kV) to the wire electrode of the corona assembly are made to act on the surface of the light-receiving member to charge the surface of the light-receiving member and eliminate charges therefrom. The corona assembly is superior in uniform charging and charge elimination.

However, corona discharge is accompanied by generation of ozone ($O_3$) in a fairly large quantity. The generated ozone oxidizes nitrogen in the air to produce nitrogen oxides ($NO_x$). The nitrogen oxides thus produced further react with water in the air to produce nitric acid and the like. The products produced by corona discharge (hereinafter referred to as "corona discharge products") such as nitrogen oxides and nitric acid may adhere to and deposit on the light-receiving member and its surrounding machinery to contaminate their surfaces. Such corona discharge products have so strong a moisture absorption that the light-receiving member surface having adsorbed them exhibits a low resistance because of the moisture absorption of the corona discharge products having adhered thereto, so that the ability of charge retention may substantially lower on the whole or in part to cause faulty images such as faint images and smeared images (a state in which the charges on the surface of the light-receiving member leak in the surface direction to cause deformation, or no formation, of patterns of electrostatic latent images).

Corona discharge products having adhered to the inner surface of the shielding plate of the corona assembly evaporate and become liberated not only while the electrophotographic apparatus is operating but also while the apparatus is not operating, e.g., at night. The corona discharge products having thus evaporated and become liberated adhere to the surface of the light-receiving member at its part corresponding to the discharge opening of the corona assembly to cause further moisture absorption. Hence, the surface of the light-receiving member may have a low resistance. Thus, the first copy initially outputted when the apparatus is again operated after inactivation, or copies on several sheets subsequent thereto, tend(s) to have faint images or smeared images occurring at the area corresponding to the opening of the corona assembly. This tends to occur especially when the corona assembly is an AC corona assembly. Moreover, in the case when the light-receiving member is an a-Si type light-receiving member, the faint images or smeared images due to the corona discharge products may becomes a large problem.

More specifically, a-Si type light-receiving members have a little lower charging and charge elimination efficiency than other light-receiving members (since the former requires a larger amount of corona charging electric currents in order to obtain the desired charging and charge elimination potential), and hence the charging and charge elimination by corona discharge applied to the a-Si type light-receiving members are carried out while greatly increasing the amount of charging electric currents. This is accomplished by increasing the voltage applied to the corona assembly compared to other light-receiving members.

The a-Si type light-receiving members are mostly used in high-speed electrophotographic apparatus. In such a case, the amount of charging electric currents may reach, e.g., 2,000 $\mu A$.

Since the amount of corona charging electric currents is proportional to the quantity of ozone produced, the ozone may be produced in an especially large quantity when the light-receiving member is an a-Si type light-receiving member and the charging and charge elimination are carried out by corona changing. Hence, the faint images or smeared images due to the corona discharge products may become a large problem.

In addition, in the case of the a-Si type light-receiving members, they have a much higher surface hardness than other photosensitive members. Accordingly, any deposits on the light-receiving member can be etched and removed only with difficulty during the step of cleaning or the like, so that the corona discharge products adhered to the surface of the light-receiving member tend to remain.

Accordingly, in conventional cases, a heater for heating the light-receiving member is provided inside the light-receiving member or hot air is blown to the light-receiving member by means of a hot-air blower and the surface of the light-receiving member is heated (to 30° C. to 50° C.) to keep the surface of the light-receiving member dry so that the corona discharge products having adhered to the surface of the light-receiving member can be prevented from absorbing moisture and making the surface of the light-receiving member exhibit a low resistance, to thereby prevent the phenomenon of faint images or smeared images. Such measures have been taken in some cases. Especially in the case of the a-Si type light-receiving members, this heating and drying means is incorporated in the electrophotographic apparatus as an essential means in some cases.

The developing assembly of such an electrophotographic apparatus has a rotary cylindrical developer carrying member internally provided with, e.g., a movable magnet. On this carrying member, a thin layer of a developer, i.e., a toner or a mixture of a toner and a carrier, is formed, and then the developer is electrostatically transferred to a light-receiving member on which an electrostatic latent image has been formed. This system is widely employed. Japanese Patent Application Laid-open No. 54-43037, No. 58-144865, No. 60-7451 and so forth disclose one example of such a system. As developers, a developer containing magnetic particles, i.e., the mixture of a toner and a carrier or a developer containing magnetite or the like in the toner and containing no carrier can be used.

In this system, by the heat from the light-receiving member, the part of the rotary cylindrical developer carrying member facing the light-receiving member expands, so that the distance between the rotary cylindrical developer carrying member and the light-receiving member becomes short at the portion for applying the developer. This makes the electric field therebetween stronger to make it easier for the developer to be transferred. This also allows the portion of the developer carrying member opposite to that portion to have a longer distance between them, so that the electric field becomes smaller to make it more difficult for the developer to be transferred than usual in some cases. As the result, the image density may become high or low due, in part, to the rotational period of the rotary cylindrical developer carrying member. Occurrence of such a phenomenon may cause substantial damage to the quality of an output image of the electrophotographic apparatus. Accordingly, it has been sought to provide a light-receiving member that rather causes faint images nor smeared images even if the light-receiving member is not heated.

In addition, in an electrophotographic apparatus that successively repeats the steps of charging, exposure, development, transfer, separation and cleaning for performing scrape cleaning by means of a blade, such repeated operation may cause a gradual increase in the frictional resistance of the surface of the light-receiving member. An increase in the frictional resistance results in a great reduction of cleaning performance in the removal of residual developer (or toner). If the copying steps are repeated in such a state, fine particles of the developer or those of external additives such as strontium titanate and silica contained in the developer may scatter to adhere to the wire electrode of the corona assembly (hereinafter referred to as "corona assembly wire") to cause discharge non-uniformity. Once the discharge non-uniformity has been caused by the wire contamination of the charging assembly, blank areas in lines, scale-like (or wavy) fog spreading over the whole image, black spots (0.1 to 0.3 mm diameter) locally occurring without periodicity, and the like may occur to cause a great reduction of the quality of output images. Also, once the corona wire contamination has occurred, an abnormal discharge is caused between the contaminated portion and the light-receiving member, so that the surface of the light-receiving member may break to cause faulty images.

SUMMARY OF THE INVENTION

The present invention was made in order to solve the problems discussed above. Accordingly, objects of the present invention are: to provide a light-receiving member that has a low frictional resistance; to prevent toner from scattering and causing contamination of the corona assembly wire in electrophotographic apparatus that successively repeat the steps of charging, exposure, development, transfer, separation and cleaning for performing scrape cleaning by means of a blade; to provide a light-receiving member substantially free of adhesion of the corona discharge products caused by corona charging; to provide a light-receiving member that can produce high-quality images free of faint images and smeared images without-regard to environmental conditions and without providing any means for heating the light-receiving member, and to provide an electrophotographic apparatus comprising such a light-receiving member and a process for producing such a light-receiving member.

Another object of the present invention is to provide a process for producing a light-receiving member, which comprises repeating plural times the steps of alternately forming a layer of a non-single-crystalline material containing at least one kind of carbon atoms, oxygen atoms and nitrogen atoms and thereafter, etching the layer on a substrate in a reactor capable of reducing an internal pressure thereof to form a surface layer; a light-receiving member produced by such a process; an electrophotographic apparatus comprising the light-receiving member and an electrophotographic method using the light-receiving member.

Still another object of the present invention is to provide a process for forming a light-receiving member which comprises the steps of etching on a substrate, forming a layer of a non-single-crystalline material containing at least one kind of carbon atoms, oxygen atoms and nitrogen atoms, and etching the layer; a light-receiving member produced by the process; an electrophotographic apparatus comprising the light-receiving member; and an electrophotographic method using the light-receiving member.

DESCRIPTION OF THE PREFERRED EMBODIMENTS

Figure 1:
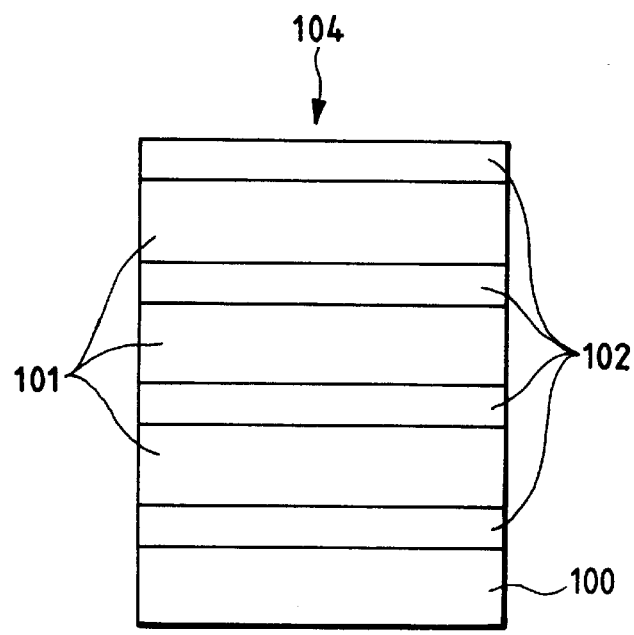
FIG. 1 is a diagrammatic cross section to show a preferred example of the configuration of a surface layer of the light-receiving member according to the present invention.

The present invention provides a process for producing a light-receiving member comprising a surface layer composed of a non-single-crystalline material containing at least one kind of carbon atoms, oxygen atoms and nitrogen atoms, which comprises repeating alternately film formation and etching plural times in a reactor; a light-receiving member produced by such a process; an electrophotographic apparatus comprising the light-receiving member; and an electrophotographic method using the light-receiving member.

In the present invention, film formation and/or etching is preferably carried out by using a high-frequency power having a discharge frequency of from 50 MHz to 450 MHz. The surface layer may further contain silicon atoms and/or hydrogen atoms.

In the present invention, fluorine atoms may preferably be contained in the whole region in the thickness direction of the surface layer.

In the etching, it is desirable to use a fluorine type gas as an etching gas, and to etch the layer preferably in a depth of 20 Å or more, and more preferably 50 Å or more.

The fluorine type gas may preferably be $CF_4$, $CHF_3$ or $ClF_3$.

For the surface layer formed by film formation and etching which are carried out once, it is desirable to have a layer thickness of preferably from 10 Å to 2,000 Å, and more preferably from 40 Å to 1,000 Å.

The surface layer may be provided on a light-receiving layer formed on a substrate. The light-receiving layer may have photoconductivity, and the light-receiving layer may comprise a photoconductive layer. The photoconductive layer may be of a single-layer type or may be of a function-separated type. Further, carbon atoms may be preferably contained in the surface layer.

In the present invention, fluorine atoms can be incorporated in the surface layer by the method as mentioned above so that the surface layer can be improved in water repellency to thereby effectively prevent the corona discharge products from adhering.

The present inventors made studies on the surface layer containing silicon atoms, carbon atoms and hydrogen atoms, in order to achieve its higher water repellency. As a result, they have discovered that a surface layer having a very high water repellency and durability can be obtained when dangling bonds of carbon atoms or C—H bonds present in the surface layer are replaced by C—F bonds and at the same time dangling bonds of Si present in the outermost surface are fluorinated (i.e., made to combine with fluorine).

Comparison of this water repellency is carried out by the evaluation based on contact angles measured when drops of pure water are placed on an evaluation sample. The greater the contact angle, the higher the water repellency.

Meanwhile, when only the outermost surface of the surface layer is fluorinated, it has been found that, in the electrophotographic apparatus that successively repeats the steps of charging, exposure, development, transfer, separation and cleaning for performing scrape cleaning by means of a blade, the outermost surface of the light-receiving member is abraded by a toner and an abrasive or the like contained in the toner, so that the water repellency becomes ineffective as a result of such repeated operation. It was also attempted to use fluorine type gases so that fluorine atoms can be actively incorporated into the surface layer. When, however, a plasma processing apparatus making use of a high-frequency power is employed, it is not easy to incorporate fluorine atoms in the film as desired. Even if it was possible to incorporate a desired content of fluorine atoms into the film, the film did not have a sufficient mechanical strength, and also the deposition must be carried out for a long time. Thus, there are some points to be more improved.

The present inventors made various studies on the above problems. As the result, they have found that fluorine atoms can be incorporated into the surface layer in a good efficiency and also in a desired content, and also at an improved deposition rate, by repeating film formation and etching plural times as previously described.

They also have found that even when formation of the surface layer is carried out by using starting gases containing no fluorine type gas, by previously coating a surface on which a deposited film is formed with fluorine atoms, reaction between fluorine atoms and carbon atoms occurs on the surface during film formation to fully form a three-dimensional network of carbon atoms into which fluorine atoms are incorporated as a terminator. As this result, it is possible to incorporate fluorine atoms into a film while having a sufficient mechanical strength and high water repellency at the same time. The deposition rate in this method is the same as that in the case where the surface is not coated with fluorine atoms, and it is possible to form a film at a large rate sufficient for practical use.

Also, in the electrophotographic apparatus that successively repeats the steps of charging, exposure, development, transfer, separation and cleaning for performing scrape cleaning by means of a blade, a surface of the surface layer with a high water repellency which always containing fluorine can be obtained while maintaining the hardness required as a surface protective layer and the initial frictional resistance, even if the outermost surface of the surface layer on the light-receiving layer has been abraded by a toner and an abrasive or the like contained in the toner. According to the present invention, fluorine atoms can also be incorporated into the surface layer in a good efficiency and also at a high density by forming the surface layer particularly under application of the high-frequency power having a discharge frequency of from 50 MHz to 450 MHz. Hence, the present invention has the effect that the surface layer can achieve a superior cleaning performance, cause no toner scatter and prevent wire contamination. This effect is also found when oxygen atoms or nitrogen atoms are present.

The present invention will be described below in detail with reference to the accompanying drawings.

FIG. 1 is a diagrammatic cross section to show a surface layer provided with a plurality of alternating regions comprising fluorine atoms diffused therein and fluorine atoms combined therewith respectively, by alternately repeating the film formation and etching according to the present invention. In FIG. 1, reference numeral 101 denotes regions in which fluorine atoms have been introduced by etching and film formation, 102 denotes regions where fluorine atoms are present in a combined state by etching after film formation, and 100 denotes a layer formed for producing a surface layer or a light-receiving layer comprising a photoconductive layer. In the example shown in the drawing presented here, the surface layer 104 is composed of eight layers. The surface layer may be composed of any number of layers so long as they are composed of a plurality of layers, which usually may preferably be within the range of 4 to 50 layers. With regard to the Outermost surface, it is particularly preferred to be a film subjected to etching. The thickness of a film deposited by film formation carried out once may be determined as desired, and may preferably be from 30 to 2,500 Å, and more preferably from 60 to 1,000 Å. Also, the respective layers may be formed under conditions constant for all the layers or conditions changed accordingly. For example, the respective layers may be formed in the manner that carbon content increases toward the surface.

Fluorine atoms can be incorporated into the surface layer in the following way: as in the formation of usual light-receiving layers, a thin layer of amorphous silicon carbide (hereinafter referred to as "a-SiC") is deposited, and thereafter a fluorine type gas is introduced to subject its surface to etching to cause fluorine atoms to combine with that surface. Next, a thin layer of a-SiC is again deposited thereon to form an a-SiC layer containing fluorine atoms utilizing the reaction of fluorine atoms on the surface of a lower deposited layer with the upper deposited layer. Then, its surface is subjected to etching in the same manner as the foregoing. This operation is repeated until the surface layer has the desired thickness, whereby a plurality of alternating regions comprising fluorine atoms contained therein and fluorine atoms combined therewith respectively can be formed. Thus, the surface layer having high hardness and high water repellency can be obtained.

Fluorine atoms contained in the surface layer are non-uniformly distributed in the layer thickness direction. Specifically, the surface layer has large content regions of fluorine atoms and small content regions of fluorine atoms. For example, the surface layer has large content regions of fluorine atoms and a small content region interposed therebetween. The surface layer may have a region containing substantially no fluorine atoms between the large content region and the small content region of fluorine atoms.

The layer removed by the etching may preferably have a depth from about 20 to 2,000 Å, and more preferably from 50 to 500 Å.

The region with which fluorine atoms have combined may preferably be in a thickness from 1 to 500 Å, and more preferably from 10 to 50 Å.

As the fluorine type gas used in the etching, fluorine type gases such as $CF_4$, $CHF_3$, $CH_2F_2$, $CH_3F$, $C_2F_6$ and $ClF_3$ may preferably be used.

Figure 2:
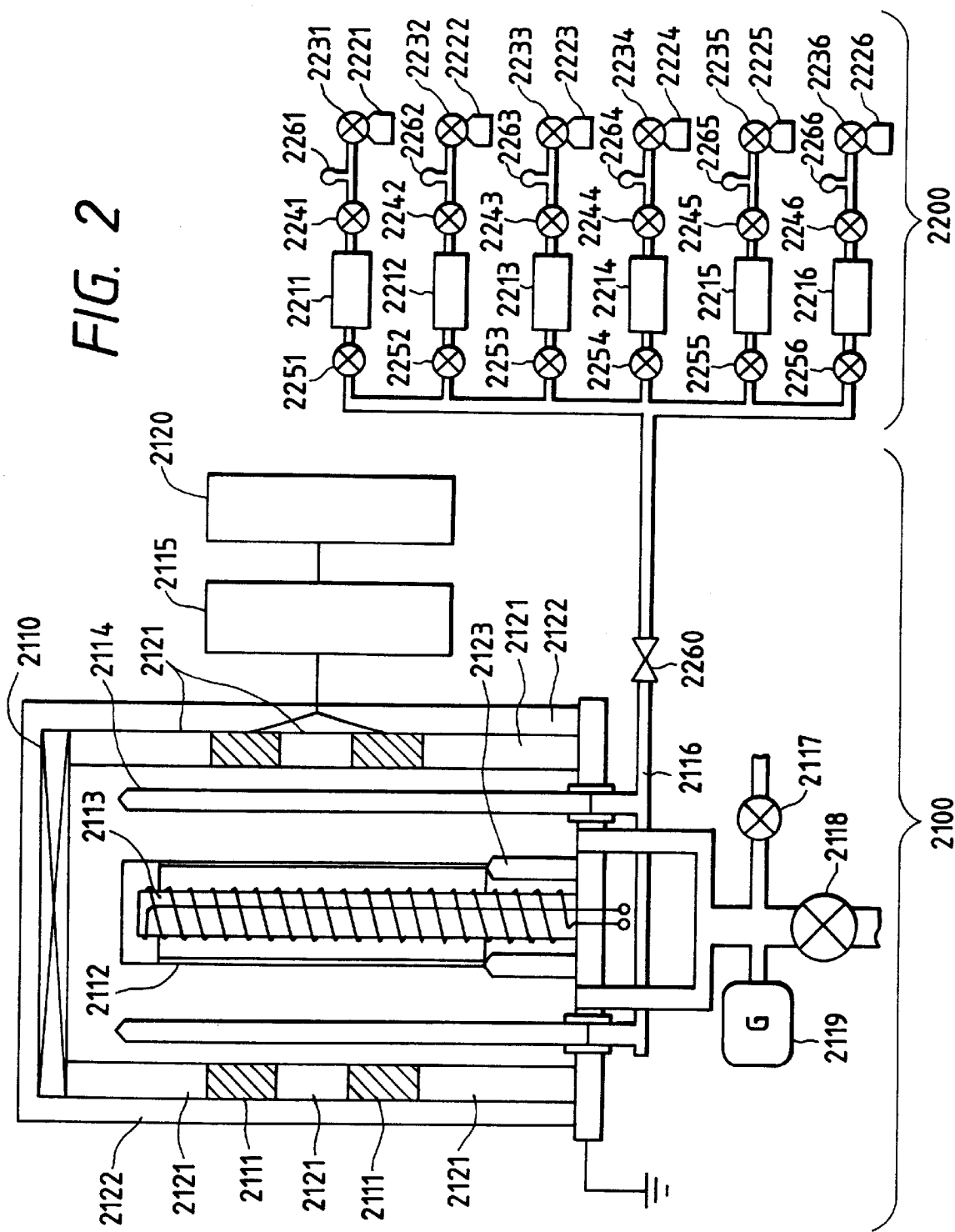
FIG. 2 is a diagrammatic view to show an example of the construction of a deposition apparatus used to produce the light-receiving member by VHF-PCVD (very high frequency)-(plasma-assisted chemical vapor deposition) applicable in the present invention.

FIG. 2 diagrammatically illustrates an example of a deposition apparatus for producing the light-receiving member by plasma-assisted CVD employing a high-frequency power source according to the present invention.

Stated roughly, this apparatus is constituted of a deposition system 2100, a starting gas feed system 2200 and an exhaust system (not shown) for reducing the internal pressure of a reactor 2110. In the reactor 2110 in the deposition system 2100, a cylindrical substrate 2112 on which a film is formed and which is connected to a ground, a heater 2113 for heating the cylindrical substrate 2112, and a starting gas feed pipe 2114 are provided. A high-frequency power source 2120 i s also connected to the reactor via a high-frequency matching box 2115.

The starting gas feed system 2200 is constituted of gas cylinders 2221 to 2226 for starting gases and etching gases, such as $SiH_4$, $H_2$, $CH_4$, NO, $B_2H_6$ and $CF_4$, valves 2231 to 2236, 2241 to 2246 and 2251 to 2256, and mass flow controllers 2211 to 2216. The gas cylinders for the respective component gases are connected to the gas feed pipe 2114 in the reactor 2110 through a valve 2260.

The high-frequency power source used in the formation of the surface layer in the present invention can be preferably used at a discharge frequency within a range of from 50 MHz to 450 MHz. If a discharge frequency higher than 450 MHz is used, the discharge stability and uniformity may become unsatisfactory and the discharge may be localized, so that the deposited films may have non-uniform layer thickness. The output power of the power source may be preferably within the range of from 10 W to 5,000 W, and there are no particular limitations on the range of output power so long as an electric power suitable for the apparatus used can be generated. With regard to the degree of output variability, there are also no particular limitations on its value so long as the desired films can be formed.

The cylindrical substrate 2112 is placed on a conductive pedestal 2123, where it is connected to a ground. Cathode electrodes 2111 are comprised of a conductive material, and are insulated with insulating materials 2121. As conductive materials used in the conductive pedestal 2123, copper, aluminum, gold, silver, platinum, lead, nickel, cobalt, iron, chromium, molybdenum, titanium, stainless steel, and composite materials of two or more of these may be used.

As the insulating materials for insulating the cathode electrodes 2111, insulating materials such as ceramics, Teflon, mica, glass, quartz, silicone rubber, polyethylene and polypropylene may be used.

As the high-frequency matching box 2115, those having any constitution can be preferably used so long as they can allow matching between the high-frequency power source 2120 and load. As methods for the matching, it may preferably be automatically controlled, or may be manually controlled without any adverse effect on the present invention.

As materials for the cathode electrodes 2111 to which the high-frequency power is to be applied, copper, aluminum, gold, silver, platinum, lead, nickel, cobalt, iron, chromium, molybdenum, titanium, stainless steel, and composite materials of two or more of these materials may be used. The cathode electrodes may preferably have a cylindrical shape, and may optionally have an ellipsoidal shape or a polygonal shape.

The cathode electrodes 2111 may be optionally provided with a cooling means. As a specific cooling means, the electrodes may be cooled with water, liquid nitrogen, Peltier devices or the like, which may be selected as occasion calls. In FIG. 2, an example is shown in which an insulating shield plate is provided around the reactor 2110.

The cylindrical substrate 2112 may be made of any material and may have any shape in accordance with its uses. For example, with regard to its shape, it may preferably be cylindrical when electrophotographic photosensitive members are produced, or may optionally have the shape of a flat plate or any other shape. With regard to its material, copper, aluminum, gold, silver, platinum, lead, nickel, cobalt, iron, chromium, molybdenum, titanium, stainless steel, and composite materials of two or more of these materials, as well as insulating materials such as polyester, polyethylene, polycarbonate, cellulose acetate, polypropylene, polyvinyl chloride, polyvinylidene chloride, polystyrene, glass, quartz, ceramics and paper which are coated with conductive materials may be used.

An example of the procedure for the formation of the light-receiving member will be described with reference to the apparatus shown in FIG. 2.

The cylindrical substrate 2112 is set in the reactor 2110, and the inside of the reactor 2110 is evacuated by means of an exhaust device (not shown; e.g., a vacuum pump). Subsequently, the temperature of the cylindrical substrate 2112 is controlled at a desired temperature of, e.g., from 20° C. to 500° C. by means of the heater 2113 for heating the cylindrical substrate. Next, before material gases for forming the light-receiving member are flowed into the reactor 2110, gas cylinder valves 2231 to 2236 and a leak valve 2117 of the reactor are checked to make sure that they are closed, and also flow-in valves 2241 to 2246, flow-out valves 2251 to 2256 and an auxiliary valve 2260 are checked to make sure that they are opened. Then, a main valve 2118 is opened to evacuate the insides of the reactor 2110 and a gas feed pipe 2116.

Thereafter, at the time a vacuum gauge 2119 has been read to indicate a pressure of about $5 \times 10^{-6}$ Torr, the auxiliary valve 2260 and the flow-out valves 2251 to 2256 are closed. Thereafter, gas cylinder valves 2231 to 2236 are opened so that gases are respectively introduced from gas cylinders 2221 to 2226, and each gas is controlled to have a pressure of 2 kg/cm$^2$ by operating pressure controllers 2261 to 2266. Next, the flow-in valves 2241 to 2246 are gradually opened so that gases are respectively introduced into mass flow controllers 2211 to 2216.

After film formation is thus ready to start through the above procedure, a photoconductive layer is first formed on the cylindrical substrate 2112.

More specifically, at the time the cylindrical substrate 2112 has had a desired temperature, some necessary flow-out valves among the valves 2251 to 2256 and the auxiliary valve 2260 are gradually opened so that desired starting gases are fed into the reactor 2110 from the gas cylinders 2221 to 2226 through a gas feed pipe 2114. Next, the mass flow controllers 2211 to 2216 are operated so that each starting gas is adjusted to flow at a desired rate. In that course, the divergence of the main valve 2118 is so adjusted that the pressure inside the reactor 2110 becomes a desired pressure of not higher than 1 Torr, while watching the vacuum gauge 2119. At the time the inner pressure has become stable, a high-frequency power source 2120 is set at a desired electric power, and a high-frequency power with a frequency of from 1 MHz to 450 MHz is supplied to the cathode electrode 2111 through the high-frequency matching box 2115 to generate high-frequency glow discharge. The starting gases fed into-the reactor 2110 are decomposed by the discharge energy thus produced, so that a desired photoconductive layer mainly composed of silicon atoms is deposited on the cylindrical substrate 2112. After a film with a desired thickness has been formed, the supply of high-frequency power is stopped, and the flow-out valves 2251 to 2256 are closed to stop starting gases from flowing into the reactor 2110. The formation of the photoconductive layer is thus completed.

The composition and layer thickness of a light-receiving layer comprising a photoconductive layer may be selected as conventionally done.

The light-receiving layer comprising a photoconductive layer and a charge injection blocking layer may be formed by non-single-crystalline materials. Specifically, an amorphous material (which also includes microcrystal), a polycrystalline material and their combination may be used. These materials preferably contain silicon atoms or germanium atoms. If necessary, they may contain an element capable of controlling a conductivity type such as boron, arsenic and phosphorus as well as at least one kind element of carbon, oxygen or nitrogen. These elements may be distributed uniformly or non-uniformly, and the distribution and the contents of these elements are determined depending on desired characteristics.

The surface layer preferably contains carbon and, for example, it may be represented by a-Si$_x$C$_{1-x}$ ($0 \leq x < 1$).

When the surface layer is formed on the photoconductive layer, basically the above operation may be repeated. Namely, film forming gases and etching gases may be alternately fed.

Stated specifically, some necessary flow-out valves among the valves 2251 to 2256 and the auxiliary valve 2260 are gradually opened so that starting gases necessary for the surface layer are fed into the reactor 2110 from the gas cylinders 2221 to 2226 through a gas feed pipe 2114.

Next, the mass flow controllers 2211 to 2216 are operated so that each starting gas is adjusted to flow at a desired rate. In that course, the divergence of the main valve 2118 is so adjusted that the pressure inside the reactor 2110 comes to be a desired pressure of not higher than 1 Torr, while watching the vacuum gauge 2119. At the time the inner pressure has become stable, a high-frequency power source 2120 is set at a desired electric power, and a high-frequency power with a frequency within the range of from 50 MHz to 450 MHz is supplied to the cathode electrode 2111 through the high-frequency matching box 2115 to generate high-frequency glow discharge. The starting gases fed into the reactor 2110 are decomposed by the discharge energy thus produced, so that an a-SiC deposited film is formed. After a film with a desired thickness has been formed, the supply of high-frequency power is stopped, and the flow-out valves 2251 to 2256 are closed to stop starting gases from flowing into the reactor 2110. The formation of the deposited film is thus completed.

Next, some necessary flow-out valves among the valves 2251 to 2256 and the auxiliary valve 2260 are gradually opened so that a fluorine type gas necessary for the etching is fed into the reactor 2110 from the gas cylinders 2221 to 2226 through a gas feed pipe 2114. Next, the mass flow controllers 2211 to 2216 are operated so that the fluorine type gas is adjusted to flow at a desired rate. In that course, the divergence of the main valve 2118 is so adjusted that the pressure inside the reactor 2110 comes to be a desired pressure of not higher than 1 Torr, while watching the vacuum gauge 2119. At the time the inner pressure has become stable, a high-frequency power source 2120 is set at a desired electric power, and a high-frequency power with a frequency within the range of from 50 MHz to 450 MHz is supplied to the cathode electrode 2111 through the high-frequency matching box 2115 to generate high-frequency glow discharge. The fluorine type gas fed into the reactor 2110 is decomposed by the discharge energy thus produced and reacts with the above deposited film, so that the etching treatment of the deposited film is carried out. After the etching treatment of the deposited film in a desired depth, the supply of high-frequency power is stopped, and the flow-out valves 2251 to 2256 are closed to stop the fluorine type gas from flowing into the reactor 2110. The etching treatment of the deposited film is thus completed. The previous operation for the film formation and this operation for the etching are alternately repeated until a desired layer thickness is obtained. Thus, the surface layer is formed.

When the film forming gases and the fluorine type gas are changed for each other, the gas or gases remaining inside the reactor 2110 may be purged every time. More preferably, from the viewpoint of film adhesion, the flow rates at the mass flow controllers may be alternately controlled without purging the reactor and, with regard to the discharge also, the discharge may be continuously carried out without stopping the discharge every time.

While the film formation is carried out, the cylindrical substrate 2112 may be rotated at a desired speed by driving means (not shown).

The deposited films formed by this apparatus is exemplified by an a-Si type photosensitive member. A cross section of a typical a-Si type photosensitive member is diagrammatically shown in FIGS. 3A and 3B.

Figure 3A:
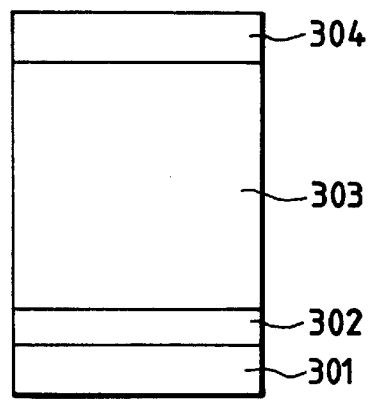
FIGS. 3A and 3B are diagrammatic cross sections to show examples of the constitution of the light-receiving member according to the present invention.
Figure 3B:
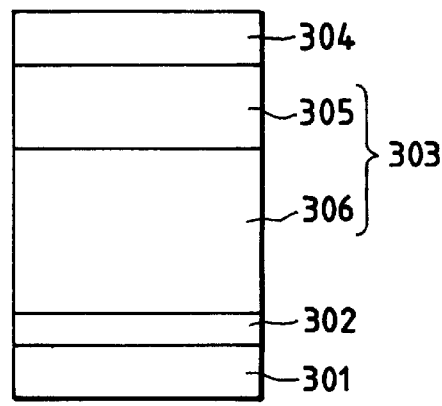

FIG. 3A illustrates a single-layer type photosensitive member comprising a photoconductive layer 303 formed of a single layer not functionally separated. FIG. 3B illustrates an example of a function-separated photosensitive member comprising a photoconductive layer 303 separated into a charge generation layer 305 and a charge transport layer 306.

The a-Si type light-receiving member shown in FIG. 3A has a conductive substrate 301 made of aluminum or the like, and a charge injection blocking layer 302, a photoconductive layer 303 and a surface layer 304 which are superposingly formed on the surface of the conductive substrate 301 in this order. Here, the charge injection blocking layer 302 is formed to block the injection of charges from the conductive substrate 301 into the photoconductive layer 303, and is optionally provided. The photoconductive layer 303 is formed of a non-single-crystalline material, preferably an amorphous material, containing at least silicon atoms and exhibiting photoconductivity. Also, the surface layer 304 contains at least carbon atoms, hydrogen atoms and fluorine atoms and is produced by the process as mentioned above, and has the ability to bear latent images formed in the electrophotographic apparatus. In the following description, the charge injection blocking layer 302 is regarded as being provided, except for the case when an effect differs depending on whether or not the charge injection blocking layer 302 is provided. The function of the charge injection blocking layer 302 may be incorporated into the photoconductive layer 303.

The a-Si type light-receiving member shown in FIG. 3B is of a function-separated type wherein the photoconductive layer 303 is constituted of a charge transport layer 306 formed of a non-single-crystalline material, preferably an amorphous material, containing at least silicon atoms and carbon atoms, and a charge generation layer 305 formed of an amorphous material containing at least silicon atoms, which are formed in this order. Upon exposure of this light-receiving member to light, carriers mainly produced in the charge generation layer 305 reach the conductive substrate 301 through the charge transport layer 306. Incidentally, the charge generation layer 305 and the charge transport layer 306 may be provided in the order reverse to that in FIG. 3B, i.e., the charge generation layer 305 may be provided on the side of the conductive substrate 301.

Figure 4:
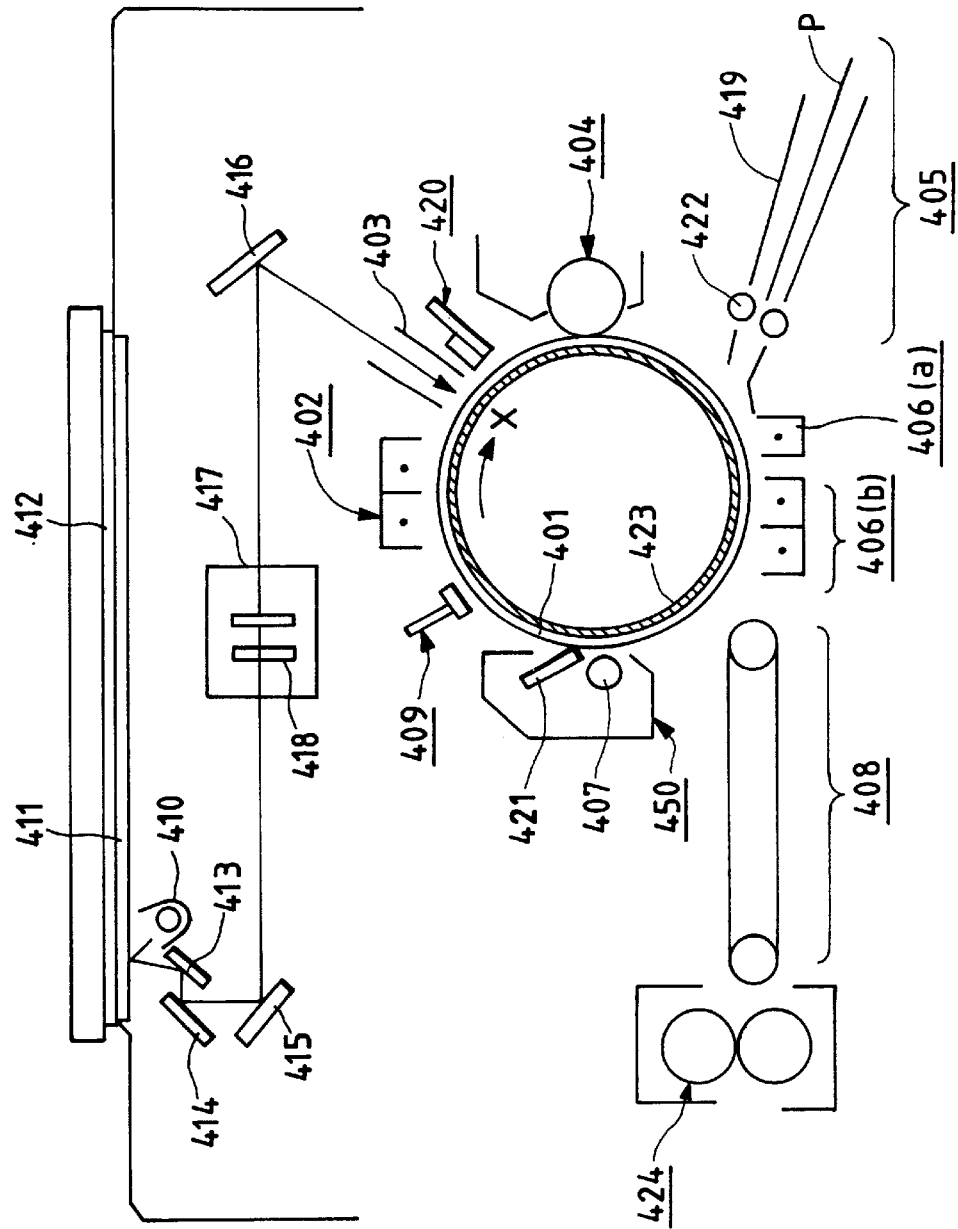
FIG. 4 is a diagrammatic cross section to illustrate an example of an electrophotographic apparatus.

FIG. 4 schematically illustrates an example of an electrophotographic apparatus, for describing an example of an image forming method embodied by the electrophotographic apparatus. A light-receiving member 401 is set temperature-controllable by means of a face heater 423 provided along the inside of the light-receiving member 401, and is rotated in the direction of an arrow X as necessary. Around the light-receiving member 401, a primary corona assembly 402, an electrostatic latent image forming portion 403, a developing assembly 404, a transfer medium feed system 405, a transfer corona assembly 406(a), a separation corona assembly 406(b), a cleaner 450, a transport system 408, a charge elimination light source 409 and so forth are provided as necessary.

An example of the image forming method will be more specifically described below. The light-receiving member 401 is uniformly electrostatically charged by means of the primary corona assembly 402, to which a high voltage of +6 to +8 kV is applied. Light emitted from a lamp 410 reflects from an original 412 placed on an original glass plate 411 and passes through mirrors 413, 414 and 415, and an image is formed through a lens 418 of a lens unit 417 and is then guided through a mirror 416 and projected into the electrostatic latent image forming portion as light that carries information, so that an electrostatic latent image is formed on the light-receiving member 401. To this latent image, a toner with a negative polarity is fed from the developing assembly 404. This exposure may be carried out not using the light reflected from the original 412 but using an LED array, a laser beam, a liquid crystal shutter array or the like so that the light that carries information is scanned to carry out scanning exposure.

Meanwhile, a transfer medium (or a recording medium) P such as paper is passed through a transfer medium feed system 405 and is fed in the direction of the light-receiving member 401 while adjusting its leading part feed timing by means of resist rollers 422. A positive electric field, having a polarity reverse to that of the toner, is imparted to the transfer medium P on the back thereof at the gap between the transfer corona assembly 406(a), to which a high voltage of +6 to +8 kV is applied, and the surface of the light-receiving member 401. As the result, the negative-polarity toner image formed on the surface of the light-receiving member is transferred to the transfer medium P. Next, it is separated from the light-receiving member 401 by means of the separation corona assembly 406(b), to which an AC voltage with a high voltage of 12 to 14 kvpp and 300 to 600 Hz. Subsequently, the transfer medium P is passed through the transfer medium transport system 408 to reach a fixing assembly 424, where the toner image is fixed, and the transfer medium P with the fixed image is delivered out of the apparatus.

The toner remaining on the light-receiving member 401 is collected by a cleaning roller 407 and a cleaning blade 421 made of an elastic material such as silicone rubber or urethane rubber which are provided in a cleaner 450, and the remaining electrostatic latent image is erased by exposure to light from the charge elimination light source 409.

Incidentally, reference numeral 420 denotes a blank exposure LED provided in order to optionally expose the light-receiving member 401 to light so that a toner may not adhere to the non-image area of the light-receiving member 401 at its portion extending beyond the width of the transfer medium P.

Figure 5:
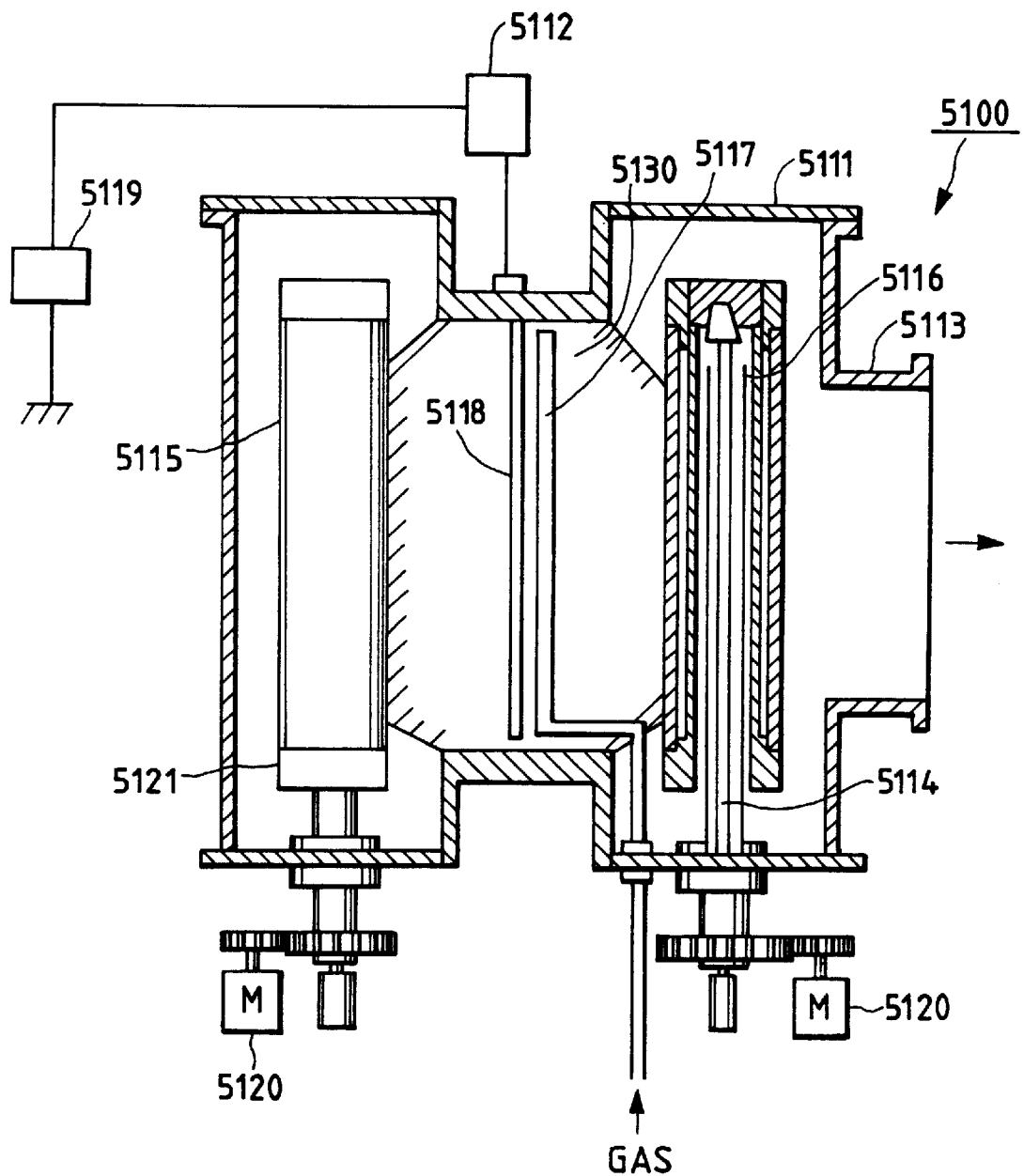
FIG. 5 is a diagrammatic cross section to show another example of a deposition apparatus used to produce the light-receiving member by VHF-PCVD applicable in the present invention.
Figure 6:
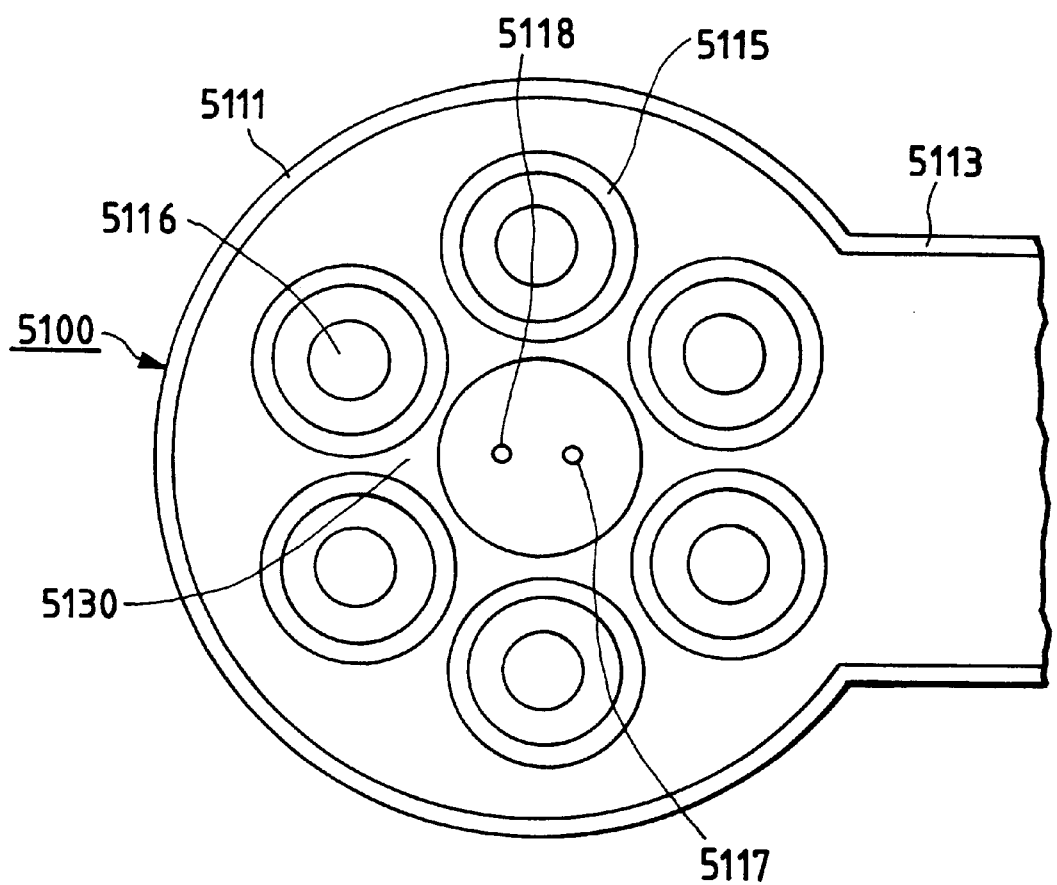
FIG. 6 is a diagrammatic transverse cross-section of the deposition apparatus shown in FIG. 5.
Figure 7:
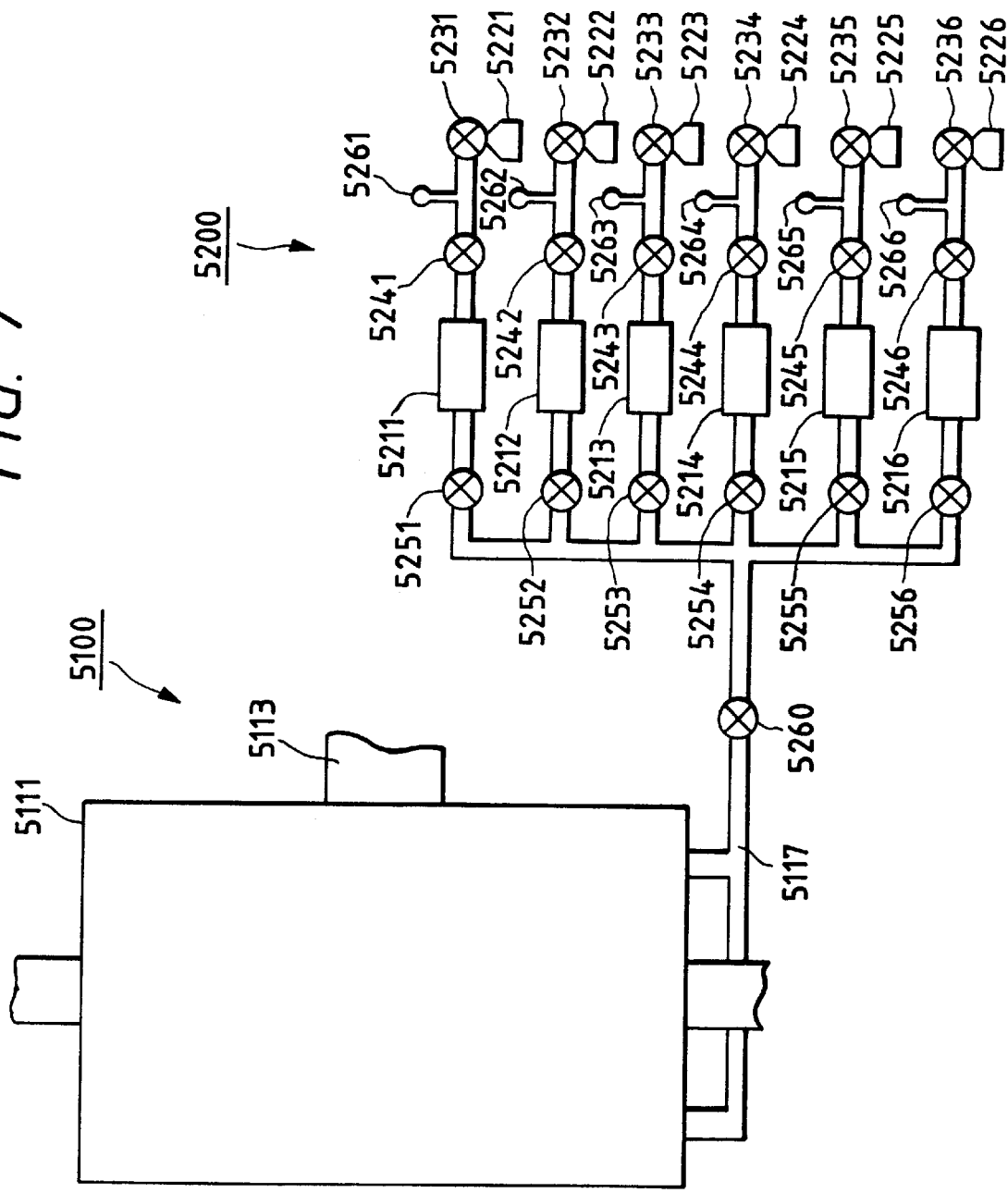
FIG. 7 is a diagrammatic view to illustrate the whole construction of the deposition apparatus shown in FIG. 5.

FIGS. 5, 6 and 7 are diagrammatic views to illustrate an example of an apparatus (a mass production type) for producing light-receiving members by VHF plasma-assisted CVD, having a form different from the apparatus shown in FIG. 2. FIG. 7 diagrammatically illustrates the whole construction of the present apparatus. FIG. 5 diagrammatically illustrates a vertical cross section at the part of its reactor. FIG. 6 diagrammatically illustrates a transverse cross section at the part of its reactor.

In FIGS. 5 to 7, reference numeral 5100 denotes a deposition system, which is so made up that it can be kept in an atmosphere of a reduced pressure. Reference numeral 5113 denotes an exhaust tube that opens to the inside of a reactor 5111 and communicates with an exhaust system (not shown) at the other end thereof. Reference numeral 5130 denotes a discharge space surrounded by a plurality of cylindrical conductive substrates 5115. A high-frequency power source 5119 is electrically connected to a cathode electrode 5118 via a high-frequency matching box 5112. The cylindrical conductive substrates 5115 are each provided around a rotating shaft 5114, being set on a pedestal 5121. A starting gas feed system 5200 has gas cylinders 5221 to 5226 in which starting gases and etching gases, such as $SiH_4$, $H_2$, $CH_4$, $N_2$, $B_2H_6$ and $CF_4$, are respectively enclosed, valves 5231 to 5236, 5241 to 5246 and 5251 to 5256, and mass flow controllers 5211 to 5216. The gas cylinders for the respective starting gases are connected to the gas feed pipe 5117 in the reactor 5111 through a valve 5260.

As the high-frequency power source used in the present invention, any power source may be used so long as it can output a power having a frequency within the range of from 50 MHz to 450 MHz as the discharge frequency at least for the formation of the surface layer. Of course, in order to form other layers (or regions), it is preferable to control the power source so that it can output a power having a frequency within a range different from that for the formation of the surface layer, or to further provide an additional power source so that it can output such a power. As for the output power, a power source having any output power may be used so long as it can produce an output power suited for the apparatus used at an output power within the range of from 10 W to 5,000 W.

With regard to the degree of output variability, there are also no particular limitations thereon.

As the high-frequency matching box 5112, those having any constitution can be preferably used so long as they can make matching between the high-frequency power source 5119 and load. As methods for the matching, it may preferably be automatically controlled, or may be manually controlled without any adverse effect on the present invention.

As materials for the cathode electrode 5118 to which the high-frequency power is to be applied, copper, aluminum, gold, silver, platinum, lead, nickel, cobalt, iron, chromium, molybdenum, titanium, stainless steel, and composite materials of two or more of these materials may be used. The cathode electrode may preferably have a cylindrical shape, and may optionally have an ellipsoidal shape or a polygonal shape. The cathode electrode 5118 may be optionally provided with a cooling means. As a specific cooling means, the electrode may be cooled with water, liquid nitrogen, Peltier devices or the like, which may be selected as occasion calls.

The cylindrical conductive substrates 5115 may be made of any material and may have any shape in accordance with its uses. For example, with regard to the shape, they may preferably be cylindrical when electrophotographic photosensitive members are produced, or may optionally have the shape of a flat. plate or any other shape. With regard to its material, copper, aluminum, gold, silver, platinum, lead, nickel, cobalt, iron, chromium, molybdenum, titanium, stainless steel, and composite materials of two or more of these materials, as well as insulating materials such as polyester, polyethylene, polycarbonate, cellulose acetate, polypropylene, polyvinyl chloride, polyvinylidene chloride, polystyrene, glass, quartz, ceramics and paper which are coated with conductive materials may be used.

The present invention will be described below in greater detail by giving Experimental Examples. The present invention is by no means limited by these.

EXPERIMENTAL EXAMPLE 1

Light-receiving members were produced under the conditions as shown in Table 1 using the plasma-assisted CVD apparatus shown in FIG. 2. The surface layer was formed by superposingly forming deposited films one after another while repeating film formation and etching. Here, formation of the deposited film having a film thickness of 1,000 Å under conditions as shown in Table 1 and the etching treatment of the deposited film having a thickness of 1,000 Å for etching in a depth of 500 Å under conditions as shown in Table 2 were repeated to form a surface layer containing fluorine atoms and having a layer thickness of 3,000 Å in total. As fluorine sources, $CF_4$, $CHF_3$ and $ClF_3$ were respectively used so that three light-receiving members were produced, corresponding to the three kinds of fluorine sources.

To evaluate the water repellency of the above three light-receiving members, the contact angles of their surfaces with respect to pure water were measured using a contact angle meter. As a result, all the light-receiving members showed a contact angle of 100 degrees or greater, having achieved a high water repellency. Then, these three light-receiving members were each mounted on a copying machine, and continuous paper feed running on 1,000,000 sheets of A4-size white paper was tested in an environment of high temperature and high humidity of 30° C. and 80% RH to make evaluation on smeared images. In this test, the steps of charging, exposure, development, transfer, separation and scrape cleaning were repeated in order, without using any heating means for the light-receiving member.

The results obtained in the above evaluation are shown in Table 3.

As is seen from the results, in the 1,000,000 sheets running, all the light-receiving members did not cause faulty images such as smeared images and stains at all. After the 1,000,000 sheets running, the contact angle was again measured. As the result, it was 100 degrees or greater in all the light-receiving members, finding that, as for gas species used in the etching, it was possible to maintain the initial water repellency when any fluorine type gases were used. Evaluation was also made on the contamination of the corona assembly wire during the running, which was evaluated on the basis of uneven halftone image density.

(Halftone Evaluation)

A method for the evaluation on uneven halftone image density will be described below with reference to FIG. 4.

The amount of charge electric currant of the primary charging assembly 402 was so controlled that the dark portion potential at the position of the developing assembly 404 was 400 V. An original 412 with a reflection density of 0.3 was placed on the original glass plate 411, and the lighting voltage of the halogen lamp 410 was so controlled that the light portion potential was 200 V, where A3-size halftone images were formed. Using the images thus formed, any uneven density in lines caused by the wire contamination was observed.

The results obtained in the above evaluation are shown in Table 4.

In the 1,000,000 sheets running, all the light-receiving members caused no uneven density in lines due to wire contamination. It has been found from this result that, as for gas species used in the etching, it was possible to maintain the initial water repellency when any fluorine type gases were used.

EXPERIMENTAL EXAMPLE 2

Light-receiving members were produced using the plasma-assisted CVD apparatus shown in FIG. 2, under conditions as shown in Table 1. When the surface layer was formed, a deposited film with a film thickness of 3,500 Å was formed at one time. The deposited film thus formed was subjected to etching by fluorine treatment on only the outermost surface under conditions as shown in Table 2, and the deposited film was etched in a depth of 500 Å so that the surface layer finally had a thickness of 3,000 Å.

As fluorine sources, $CF_4$, $CHF_3$ and $ClF_3$ were respectively used so that three light-receiving members were produced, corresponding to the three kinds of fluorine sources.

To evaluate the water repellency of the above three light-receiving members, the contact angles of their surfaces with respect to pure water were measured in the same manner as in Experimental Example 1. As a result, all the light-receiving members showed a contact angle of 100 degrees or greater, having achieved a high water repellency.

Then, these three light-receiving members were tested in the same manner as in Experimental Example 1 by continuous paper feed running on A4-size 1,000,000 sheets in an environment of high temperature and high humidity of 30° C. and 80% RH to make evaluation on smeared images. In this test, like Experimental Example 1, the steps of Charging, exposure, development, transfer, separation and scrape cleaning were repeated in order, without using any heating means for the light-receiving member.

The results obtained in the above evaluation are shown in Table 3.

As is seen from the results, in the 1,000,000 sheets running, all the light-receiving members caused smeared images on the 500,000th sheet and thereafter in some cases.

After the 1,000,000 sheets running, the contact angle of each light-receiving member was again measured. As the result, it was at the value of 50 degrees or less in all the light-receiving members.

Evaluation was also made on the contamination of the corona assembly wire during the running, which was evaluated on the basis of uneven halftone image density in the same manner as in Experimental Example 1.

The results obtained in the above evaluation are shown in Table 4.

As is seen from the results, in the 1,000,000 sheets running, the uneven density in lines caused by the wire contamination in all the light-receiving members was on the level of no problem in practical use.

TABLE 1

| Conditions for Production of Light-receiving Member | |
|---|---|
| Lower blocking layer | |
| $SiH_4$ | 300 SCCM |
| $H_2$ | 500 SCCM |
| NO | 8 SCCM |
| $B_2H_6$ | 2,000 ppm |
| Power | 100 W (105 MHz) |
| Internal pressure | 20 mTorr |
| Layer thickness | 1 μm |
| Photoconductive layer | |
| $SiH_4$ | 500 SCCM |
| $H_2$ | 500 SCCM |
| Power | 400 W (105 MHz) |
| Internal pressure | 20 mTorr |
| Layer thickness | 20 μm |
| Surface layer | |
| $SiH_4$ | 50 SCCM |
| $CH_4$ | 500 SCCM |
| Power | 100 W (105 MHz) |
| Internal pressure | 20 mTorr |
| Layer thickness | 0.3 μm |

TABLE 2

| Conditions for Fluorine Treatment | |
|---|---|
| $CF_4$ | 500 SCCM |
| Substrate temperature | 250° C. |
| Pressure | 20 mTorr |
| Power | 500 W (105 MHz) |
| Etching depth | 0.05 μm |

TABLE 3

| | Initial stage | $1 \times 10^5$ sheets | $3 \times 10^5$ sheets | $5 \times 10^5$ sheets | $8 \times 10^5$ sheets | $1 \times 10^6$ sheets |
|---|---|---|---|---|---|---|
| | | Experimental Example 1: | | | | |
| $CF_4$ | A | A | A | A | A | A |
| $CHF_3$ | A | A | A | A | A | A |
| $ClF_3$ | A | A | A | A | A | A |
| | | Experimental Example 2: | | | | |
| $CF_4$ | A | A | A | B | C | C |
| $CHF_3$ | A | A | A | B | C | C |
| $ClF_3$ | A | A | A | B | C | C |

A: No smeared images.
B: Smeared images partly occur in some cases.
C: Smeared images occur over the whole area in some cases.

TABLE 4

|  | Initial stage | $1 \times 10^5$ sheets | $3 \times 10^5$ sheets | $5 \times 10^5$ sheets | $8 \times 10^5$ sheets | $1 \times 10^6$ sheets |
|---|---|---|---|---|---|---|
| Experimental Example 1: |
| $CF_4$ | AA | AA | AA | AA | AA | AA |
| $CHF_3$ | AA | AA | AA | AA | AA | AA |
| $ClF_3$ | AA | AA | AA | AA | AA | AA |
| Experimental Example 1: |
| $CF_4$ | AA | AA | AA | A | A | B |
| $CHF_3$ | AA | AA | AA | A | A | B |
| $ClF_3$ | AA | AA | AA | A | A | B |

Uneven halftone image density:
AA: Very well free of uneven density.
A: Well free of uneven density.
B: Uneven density partly occur (no problem in practical use).
C: Uneven density in lines occur over the whole area of images in some cases.

EXPERIMENTAL EXAMPLE 3

Light-receiving members were produced in the same manner as in Experimental Example 1 while repeating the film formation and etching to form the surface layer having a layer thickness of 3,000 Å in total, except that, in the formation of the surface layer, the thickness of deposited films and the etching depth by etching treatment were varied in five ways as shown in Table 5 below. $CF_4$ gas was used as the fluorine source.

TABLE 5

| Deposited film thickness (Å) | Etching depth (Å) | Light-receiving member |
|---|---|---|
| 520 | 20 | (A) |
| 550 | 50 | (B) |
| 600 | 100 | (C) |
| 1,000 | 500 | (D) |
| 1,500 | 1,000 | (E) |

To evaluate the water repellency of the above five light-receiving members (A) to (E), the contact angles of their surfaces with respect to pure water were measured in the same manner as in Experimental Example 1. As a result, all the light-receiving members showed a contact angle of 100 degrees or greater, having achieved a high water repellency.

Next, these five light-receiving members were tested in the same manner as in Experimental Example 1 by continuous paper feed running on A4-size 1,000,000 sheets in an environment of high temperature and high humidity of 30° C. and 80% RH to make evaluation on smeared images. In this test, like Experimental Example 1, the respective steps were repeated without using any heating means for the light-receiving member.

The results obtained in the above evaluation are shown in Table 6.

As is seen from the results, in the 1,000,000 sheets running, all the light-receiving members did not cause faulty images such as smeared images and stains at all. After the 1,000,000 sheets running, the contact angle was again measured. As the result, it was 100 degrees or greater in all the light-receiving members, finding that it was possible to maintain the initial water repellency so long as the etching for each time was in a depth of at least 20 Å.

Evaluation was also made on wire contamination of the corona assembly during the running, which was evaluated on the basis of uneven halftone image density in the same manner as in Experimental Example 1.

The results obtained in the above evaluation are shown in Table 7.

In the 1,000,000 sheets running, all the light-receiving members caused no uneven density in lines due to wire contamination. It has been found from this result that it was possible to maintain the initial water repellency so long as the etching for each time was in a depth of at least 20 Å.

EXPERIMENTAL EXAMPLE 4

A light-receiving members was produced using the plasma-assisted CVD apparatus shown in FIG. 2, under conditions as shown in Table 1. Here, the surface layer was formed by continuously forming the deposited film without inserting the step of etching, to have a layer thickness of 3,000 Å.

To evaluate the water repellency of the above light-receiving member, the contact angle of its surface with respect to pure water was measured in the same manner as in Experimental Example 1. An a result the contact angle was 80 degrees.

Next, this light-receiving member was tested in the same manner as in Experimental Example 1 by continuous paper feed running on A4-size 1,000,000 sheets in an environment of high temperature and high humidity of 30° C. and 80% RH to make evaluation on smeared images. In this test, like Experimental Example 1, the respective steps were repeated without using any heating means for the light-receiving member.

The results obtained in the above evaluation are shown in Table 6.

As is seen from the results, in the 1,000,000 sheets running, the light-receiving member caused smeared images on the 100,000th sheet and thereafter. After the 1,000,000 sheets running, the contact angle of the light-receiving member was again measured. As the result, it was at the value of 20 degrees or less, confirming that it was impossible for the surface layer containing no fluorine atoms to maintain the initial water repellency.

Evaluation was also made on wire contamination of the corona assembly during the running, which was evaluated on the basis of uneven halftone image density in the same manner as in Experimental Example 1.

The results obtained in the above evaluation are shown in Table 7. As is seen from the results, in the 1,000,000 sheets running, the uneven density in lines caused by wire contamination was on the level of no problem in practical use.

TABLE 6

|  | Initial stage | $1 \times 10^5$ sheets | $3 \times 10^5$ sheets | $5 \times 10^5$ sheets | $8 \times 10^5$ sheets | $1 \times 10^6$ sheets |
|---|---|---|---|---|---|---|
| Experimental Example 3: |
| (A) | A | A | A | A | A | A |
| (B) | A | A | A | A | A | A |
| (C) | A | A | A | A | A | A |
| (D) | A | A | A | A | A | A |
| (E) | A | A | A | A | A | A |

TABLE 6-continued

| | Initial stage | $1 \times 10^5$ sheets | $3 \times 10^5$ sheets | $5 \times 10^5$ sheets | $8 \times 10^5$ sheets | $1 \times 10^6$ sheets |
|---|---|---|---|---|---|---|
| Experimental Example 4: | | | | | | |
| | A | B | B | C | C | C |

A: No smeared images.
B: Smeared images partly occur in some cases.
C: Smeared images occur over the whole area in some cases.

TABLE 7

| | Initial stage | $1 \times 10^5$ sheets | $3 \times 10^5$ sheets | $5 \times 10^5$ sheets | $8 \times 10^5$ sheets | $1 \times 10^6$ sheets |
|---|---|---|---|---|---|---|
| Experimental Example 3: | | | | | | |
| (A) | AA | AA | AA | AA | AA | AA |
| (B) | AA | AA | AA | AA | AA | AA |
| (C) | AA | AA | AA | AA | AA | AA |
| (D) | AA | AA | AA | AA | AA | AA |
| (E) | AA | AA | AA | AA | AA | AA |
| Experimental Example 2: | | | | | | |
| | AA | AA | A | A | A | B |

Uneven halftone image density:
AA: Very well free of uneven density.
A: Well free of uneven density.
B: Uneven density partly occur (no problem in practical use).
C: Uneven density in lines occur over the whole area of images in some cases.

EXPERIMENTAL EXAMPLE 5

Light-receiving members were produced in the same manner as in Experimental Example 1 while repeating film formation and etching to form the surface layer having a layer thickness of 4,000 Å in total, except that the thickness of deposited films and the etching depth by etching treatment were varied in six ways as shown in Table 8 below. $CF_4$ gas was used as the fluorine source.

TABLE 8

| Deposited film thickness (Å) | Etching depth (Å) | Light-receiving member |
|---|---|---|
| 520 | 500 | (F) |
| 550 | 500 | (G) |
| 600 | 500 | (H) |
| 1,000 | 500 | (I) |
| 1,500 | 500 | (J) |
| 2,500 | 500 | (K) |

To evaluate the water repellency of the above six light-receiving members (F) to (K), the contact angles of their surfaces with respect to pure water were measured in the same manner as in Experimental Example 1. As a result, all the light-receiving members showed a contact angle of 100 degrees or greater, having achieved a high water repellency.

Next, these six light-receiving members were tested in the same manner as in Experimental Example 1 by continuous paper feed running on A4-size 1,000,000 sheets in an environment of high temperature and high humidity of 300° C. and 80% RH to make evaluation on smeared images. In this test, like Experimental Example 1, the respective step were repeated without using any heating means for the light-receiving member.

The results obtained in the above evaluation are shown in Table 9.

As seen from the results, in the 1,000,000 sheets running, all the light-receiving members did not cause faulty images such as smeared images at all. After the 1,000,000 sheets running, the contact angle was again measured. As the result, it was 100 degrees or greater in the light-receiving members other than (K), finding that it was possible to maintain the initial water repellency. With regard to the light-receiving member (K), however, the contact angle was 75 degrees after 500,000 sheet running. All the light-receiving members caused no faulty images such as stains.

Evaluation was also made on the wire contamination of the corona assembly during the running, which was evaluated on the basis of uneven halftone image density in the same manner as in Experimental Example 1.

The results obtained in the above evaluation are shown in Table 10.

As is seen from the results, in the 1,000,000 sheets running, all the light-receiving members caused no uneven density in lines due to wire contamination.

It has been found from the foregoing results that in formation of the surface layer comprising deposited films formed by repeating film formation and etching, a thickness of each deposited film preferably is not larger than 2,500 Å. If each thickness of the deposited films is smaller than 30 Å, the deposited film may have an insufficient uniformity, or the total surface layer formation takes a longer time because of an increase in the number of etching times.

TABLE 9

| | Initial stage | $1 \times 10^5$ sheets | $3 \times 10^5$ sheets | $5 \times 10^5$ sheets | $8 \times 10^5$ sheets | $1 \times 10^6$ sheets |
|---|---|---|---|---|---|---|
| Experimental Example 5: | | | | | | |
| (F) | A | A | A | A | A | A |
| (G) | A | A | A | A | A | A |
| (H) | A | A | A | A | A | A |
| (I) | A | A | A | A | A | A |
| (J) | A | A | A | A | A | A |
| (K) | A | A | A | B | B | B |
| Experimental Example 6: | | | | | | |
| (F') | A | A | A | A | A | A |
| (G') | A | A | A | A | A | A |
| (H') | A | A | A | A | A | A |
| (I') | A | A | A | A | A | A |
| (J') | A | A | A | A | A | A |
| (K') | A | A | A | B | B | C |

A: No smeared images.
B: Smeared images partly occur in some cases.
C: Smeared images occur over the whole area in some cases.

TABLE 10

| | Initial stage | $1 \times 10^5$ sheets | $3 \times 10^5$ sheets | $5 \times 10^5$ sheets | $8 \times 10^5$ sheets | $1 \times 10^6$ sheets |
|---|---|---|---|---|---|---|
| Experimental Example 5: | | | | | | |
| (F) | AA | AA | AA | AA | AA | AA |
| (G) | AA | AA | AA | AA | AA | AA |
| (H) | AA | AA | AA | AA | AA | AA |
| (I) | AA | AA | AA | AA | AA | AA |
| (J) | AA | AA | AA | AA | AA | AA |
| (K) | AA | AA | AA | A | A | A |

TABLE 10-continued

|     | Initial stage | $1 \times 10^5$ sheets | $3 \times 10^5$ sheets | $5 \times 10^5$ sheets | $8 \times 10^5$ sheets | $1 \times 10^6$ sheets |
|-----|---------------|------------------------|------------------------|------------------------|------------------------|------------------------|
| Experimental Example 6: |
| (F') | A | A | A | A | A | B |
| (G') | A | A | A | A | A | B |
| (H') | A | A | A | A | A | B |
| (I') | A | A | A | A | A | B |
| (J') | A | A | A | A | A | B |
| (K') | A | A | A | A | B | B |

Uneven halftone image density:
AA: Very well free of uneven density.
A: Well free of uneven density.
B: Uneven density partly occur (no problem in practical use).
C: Uneven density in lines occur over the whole area of images in some cases.

EXPERIMENTAL EXAMPLE 6

Light-receiving members were produced in the same manner as in Experimental Example 1 while repeating the film formation and etching to form the surface layer having a layer thickness of 4,000 Å in total, except that the surface layer was formed using a high-frequency power of 13.5 MHz under conditions as shown in Table 11 below and the deposited films were formed, and etched by fluorine treatment, while the film thickness and the etching depth were varied in six ways as shown in Table 12 below. $CF_4$ gas was used as the fluorine source.

TABLE 11

| Surface layer | |
|---|---|
| $SiH_4$ | 50 SCCM |
| $CH_4$ | 500 SCCM |
| Power | 100 W (13.56 MHz) |
| Internal pressure | 0.4 Torr |
| Fluorine treatment conditions | |
| $CF_4$ | 500 SCCM |
| Substrate temp. | 250° C. |
| Pressure | 0.4 Torr |
| Power | 500 W (13.56 MHz) |

TABLE 12

| Deposited film thickness (Å) | Etching depth (Å) | Light-receiving member |
|---|---|---|
| 520 | 500 | (F') |
| 550 | 500 | (G') |
| 600 | 500 | (H') |
| 1,000 | 500 | (I') |
| 1,500 | 500 | (J') |
| 2,500 | 500 | (K') |

To evaluate the water repellency of the above six light-receiving members (F') to (K'), the contact angles of their surfaces with respect to pure water were measured in the same manner as in Experimental Example 1. As a result, all the light-receiving members showed a contact angle of 100 degrees or greater, having achieved a high water repellency.

Next, these six light-receiving members were tested in the same manner as in Experimental Example 1 by continuous paper feed running on A4-size 1,000,000 sheets in an environment of high temperature and high humidity of 30° C. and 80% RH to make evaluation on smeared images. In this test, like Experimental Example 1, the respective steps were repeated without using any heating means for the light-receiving member.

The results obtained in the above evaluation are shown in Table 9.

As is seen from the results, in the 1,000,000 sheets running, all the light-receiving members other than (K') caused no faulty images such as smeared images at all. After the 1,000,000 sheets running, the contact angle was again measured. As the result, it was 75 degrees or greater in the light-receiving members other than (K'), finding that it was possible to maintain a water repellency endurable to practical use. With regard to the light-receiving member (K'), however, the contact angle was 50 degrees after 1,000,000 sheets running. All the light-receiving members caused no faulty images such as stains.

Evaluation was also made on the wire contamination of the corona assembly during the running, which was evaluated on the basis of uneven halftone image density in the same manner as in Experimental Example 1.

The results obtained in the above evaluation are shown in Table 10.

As is seen from Table 10, in the 1,000,000 sheets running, the uneven density in lines caused by wire contamination was on the level of no problem in practical use. However, all the light-receiving members of Experimental Example 6 were found to have caused uneven density in part when the 1,000,000 sheets running was finished.

It has been found from the foregoing results that, when the high-frequency power source used in the formation of the surface layer is used at a frequency of from 50 MHz to 450 MHz, the structure of films can be made more dense, the fluorine atoms can be incorporated in an improved efficiency, and the cleaning performance can be more improved than the conventional cases.

EXPERIMENTAL EXAMPLE 7

Light-receiving members were produced using the plasma-assisted CVD apparatus shown in FIG. 2, under conditions as shown in Table 1. In the formation of the surface layer, the deposited films were formed in a film thickness of 1,000 Å for each time. The deposited films thus formed were each subjected to fluorine treatment under conditions as shown in Table 2 while repeating etching in a depth of 500 Å, to form surface layers containing fluorine atoms comprising the deposited films each having a film thickness as shown in Table 13. $CF_4$ gas was used as the fluorine source.

TABLE 13

| Deposited film thickness (Å) | Etching depth (Å) | Surface layer thickness (Å) | Light-receiving member |
|---|---|---|---|
| 1,000 | 500 | 1,000 | (L) |
| 1,000 | 500 | 2,000 | (M) |
| 1,000 | 500 | 3,000 | (N) |
| 1,000 | 500 | 4,000 | (O) |

To evaluate the water repellency of the above four light-receiving members (L) to (O), the contact angles of their surfaces with respect to pure water were measured in the same manner as in Experimental Example 1. As a result, all the light-receiving members showed a contact angle of 100 degrees or greater, having achieved a high water repellency.

Next, these four light-receiving members were tested in the same manner as in Experimental Example 1 by continuous paper feed running on A4-size 1,000,000 sheets in an environment of high temperature and high humidity of 30° C. and 80% RH to make evaluation on smeared images. In this test, like Experimental Example 1, the respective steps were repeated without using any heating means for the light-receiving member.

The results obtained in the above evaluation are shown in Table 14.

In the 1,000,000 sheets running, all the light-receiving members caused no faulty images such as smeared images and stains at all. As is seen from the results, the effect of the present invention can be obtained when a pair of the film formation and the etching treatment is repeatedly carried out at least two times.

Evaluation was also made on wire contamination of the corona assembly during the running, which was evaluated on the basis of uneven halftone image density in the same manner as in Experimental Example 1.

The results obtained in the above evaluation are shown in Table 15. As is seen from the results, in the 1,000,000 sheets running, all the light-receiving members caused no uneven density in lines due to wire contamination.

TABLE 14

| | Initial stage | $1 \times 10^5$ sheets | $3 \times 10^5$ sheets | $5 \times 10^5$ sheets | $8 \times 10^5$ sheets | $1 \times 10^6$ sheets |
|---|---|---|---|---|---|---|
| | | | Experimental Example 7: | | | |
| (L) | A | A | A | A | A | A |
| (M) | A | A | A | A | A | A |
| (N) | A | A | A | A | A | A |
| (O) | A | A | A | A | A | A |

A: No smeared images.
B: Smeared images partly occur in some cases.
C: Smeared images occur over the whole area in some cases.

TABLE 15

| | Initial stage | $1 \times 10^5$ sheets | $3 \times 10^5$ sheets | $5 \times 10^5$ sheets | $8 \times 10^5$ sheets | $1 \times 10^6$ sheets |
|---|---|---|---|---|---|---|
| | | | Experimental Example 7: | | | |
| (L) | AA | AA | AA | AA | AA | AA |
| (M) | AA | AA | AA | AA | AA | AA |
| (N) | AA | AA | AA | AA | AA | AA |
| (O) | AA | AA | AA | AA | AA | AA |

Uneven halftone image density:
AA: Very well free of uneven density.
A: Well free of uneven density.
B: Uneven density partly occur (no problem in practical use).
C: Uneven density in lines occur over the whole area of images in some cases.

EXPERIMENTAL EXAMPLE 8

A light-receiving member was produced using the plasma-assisted CVD apparatus shown in FIG. 2, under conditions as shown in Table 16. In the formation of the surface layer, the deposited films were formed in a layer thickness of 1,000 Å for each time. The deposited films thus formed were each subjected to fluorine treatment under conditions as shown in Table 2 while repeating etching in a depth of 500 Å, to form a surface layer containing fluorine atoms and having a layer thickness of 3,000 Å in total.

To evaluate the water repellency of the above light-receiving member, the contact angle of its surface with respect to pure water was measured in the same manner as in Experimental Example 1. As a result, the light-receiving member showed a contact angle of 100 degrees or greater, having achieved a high water repellency.

Next, this light-receiving member was tested in the same manner as in Experimental Example 1 by continuous paper feed running on A4-size 1,000,000 sheets in an environment of high temperature and high humidity of 30° C. and 80% RH to make evaluation on smeared images. In this test, like Experimental Example 1, the respective steps were repeated without using any heating means for the light-receiving member.

The results obtained in the above evaluation are shown in Table 17. As is seen from the results, in the 1,000,000 sheets running, the light-receiving member caused no faulty images such as smeared images and stains at all.

Evaluation was also made on wire contamination of the corona assembly during the running, which was evaluated on the basis of uneven halftone image density in the same manner as in Experimental Example 1.

The results obtained in the above evaluation are shown in Table 18. As is seen from the results, in the 1,000,000 sheets running, the light-receiving member caused no uneven density in lines due to wire contamination.

It has been found from the foregoing results that the surface layer was not affected by layer configuration of other layers and by discharge frequency.

TABLE 16

| Conditions for Production of Light-receiving Member | |
|---|---|
| Lower blocking layer | |
| $SiH_4$ | 300 SCCM |
| $H_2$ | 500 SCCM |
| $B_2H_6$ | 2,000 ppm |
| Power | 100 W (13.56 MHz) |
| Internal pressure | 0.2 mTorr |
| Layer thickness | 1 μm |
| Charge transport layer | |
| $SiH_4$ | 500 SCCM |
| $H_2$ | 500 SCCM |
| $CH_4$ | 50 SCCM |
| Power | 300 W (13.56 MHz) |
| Internal pressure | 0.2 mTorr |
| Layer thickness | 15 μm |
| Charge generation layer | |
| $SiH_4$ | 500 SCCM |
| $H_2$ | 500 SCCM |
| Power | 300 W (13.56 MHz) |
| Internal pressure | 0.2 mTorr |
| Layer thickness | 5 μm |
| Surface layer | |
| $SiH_4$ | 50 SCCM |
| $CH_4$ | 500 SCCM |
| Power | 100 W (105 MHz) |
| Internal pressure | 20 mTorr |
| Layer thickness | 0.3 μm |

TABLE 17

| Initial stage | $1 \times 10^5$ sheets | $3 \times 10^5$ sheets | $5 \times 10^5$ sheets | $8 \times 10^5$ sheets | $1 \times 10^6$ sheets |
|---|---|---|---|---|---|
| Experimental Example 8: | | | | | |
| A | A | A | A | A | A |

A: No smeared images.
B: Smeared images partly occur in some cases.
C: Smeared images occur over the whole area in some cases.

TABLE 18

| Initial stage | $1 \times 10^5$ sheets | $3 \times 10^5$ sheets | $5 \times 10^5$ sheets | $8 \times 10^5$ sheets | $1 \times 10^6$ sheets |
|---|---|---|---|---|---|
| Experimental Example 8: | | | | | |
| AA | AA | AA | AA | AA | AA |

Uneven halftone image density:
AA: Very well free of uneven density.
A: Well free of uneven density.
B: Uneven density partly occur (no problem in practical use).
C: Uneven density in lines occur over the whole area of images in some cases.

EXPERIMENTAL EXAMPLE 9

Light-receiving member were produced using the plasma-assisted CVD apparatus described with reference to FIGS. 5 to 7, under conditions as shown in Table 1. In the formation of the surface layer, formation of the deposited film having in a film thickness of 1,000 Å for one time and the fluorine treatment of the deposited film thus formed under conditions as shown in Table 2 for etching in a depth of 500 Å were repeated to form a surface layer containing fluorine atoms and having a layer thickness of 3,000 Å in total.

To evaluate the water repellency of the above light-receiving members, the contact angles of their surfaces with respect to pure water were measured in the same manner as in Experimental Example 1. As a result, the light-receiving member showed a contact angle of 100 degrees or greater, having achieved a high water repellency.

Next, this light-receiving member was tested in the same manner as in Experimental Example 1 by continuous paper feed running on A4-size 1,000,000 sheets in an environment of high temperature and high humidity of 30° C. and 80% RH to make evaluation on smeared images. In this case also, like Experimental Example 1, the running was tested without using any heating means for the light-receiving member.

The results obtained in the above evaluation are shown in Table 19. As is seen from the results, in the 1,000,000 sheets running, the light-receiving member caused no faulty images such as smeared images and stains at all.

Evaluation was also made on wire contamination of the corona assembly during the running, which was evaluated on the basis of uneven halftone image density in the same manner as in Experimental Example 1.

The results obtained in the above evaluation are shown in Table 20. As is seen from the results, in the 1,000,000 sheets running, the light-receiving member caused no uneven density in lines due to wire contamination.

It has been found from the foregoing results that the production process of the present invention brought about good results without regard to the constitution of the film forming apparatus.

TABLE 19

| Initial stage | $1 \times 10^5$ sheets | $3 \times 10^5$ sheets | $5 \times 10^5$ sheets | $8 \times 10^5$ sheets | $1 \times 10^6$ sheets |
|---|---|---|---|---|---|
| Experimental Example 9: | | | | | |
| A | A | A | A | A | A |

A: No smeared images.
B: Smeared images partly occur in some cases.
C: Smeared images occur over the whole area in some cases.

TABLE 20

| Initial stage | $1 \times 10^5$ sheets | $3 \times 10^5$ sheets | $5 \times 10^5$ sheets | $8 \times 10^5$ sheets | $1 \times 10^6$ sheets |
|---|---|---|---|---|---|
| Experimental Example 9: | | | | | |
| AA | AA | AA | AA | AA | AA |

Uneven halftone image density:
AA: Very well free of uneven density.
A: Well free of uneven density.
B: Uneven density partly occur (no problem in practical use).
C: Uneven density in lines occur over the whole area of images in some cases.

EXPERIMENTAL EXAMPLE 10

Light-receiving members were produced using the plasma-assisted CVD apparatus shown in FIG. 2. The lower blocking layer, photoconductive layer and surface layer were formed under conditions as shown in Table 21. Here, the deposited film constituting the surface layer was formed in a film thickness of 1,000 Å. The deposited film of 1,000 Å thick thus formed was subjected to etching under conditions as shown in Table 22 to etch the film in a depth of 500 Å. Thereafter, the film formation and the etching treatment were repeated under the same conditions to form a surface layer containing fluorine atoms and having a layer thickness of 3,000 Å in total. As fluorine sources, $CF_4$, $CHF_3$ and $ClF_3$ were respectively used so that corresponding three light-receiving members were produced.

To evaluate the water repellency of the above light-receiving members, the contact angles of their surfaces with respect to pure water were measured using the contact angle meter. As a result, they all showed a contact angle of 100 degrees or greater, having achieved a high water repellency.

Then, these light-receiving members were each mounted on the copying machine previously described, and continuous paper feed running on 1,000,000 sheets of A4-size paper was tested in an environment of high temperature and high humidity of 30° C. and 80% RH to make evaluation on smeared images. In this test, the steps of charging, exposure, development, transfer, separation and scrape cleaning were repeated in order, without using any heating means for the light-receiving member.

(Evaluation on Smeared Images)

As an evaluation method on smeared images, the evaluation was made using a test chart with 6 point or smaller characters printed on the whole surface. Taking account of the effect of paper dust on images in the case when reclaimed paper, recently used increasingly, or low-quality paper is used, the reclaimed paper was used this time. The paper used this time contains fillers such as talc in a large quantity, which are known to greatly affect the characteristics on smeared images.

The results obtained in the above evaluation are shown in Table 23. In Table 23 and the subsequent similar tables, letter symbols denote as follows:

A: Clear images.

B: Smeared images partly occur in some cases.

C: Smeared images occur over the whole area in some cases.

As is seen from the results, in the 1,000,000 sheets running, all the light-receiving members caused no faulty images such as smeared images and stains at all. After the 1,000,000 sheets running, the contact angle was again measured. As the result, it was 100 degrees or greater in all the light-receiving members, finding that it was possible to maintain the initial water repellency.

Evaluation was also made on wire contamination of the corona assembly after the running, which was evaluated on the basis of uneven halftone image density.

(Halftone Evaluation)

A method for the evaluation on uneven halftone image density will be described below with reference to FIG. 4.

The amount of charge electric current of the primary corona assembly 402 was so controlled that the dark portion potential at the position of the developing assembly 404 was 400 V. An original 412 with a reflection density of 0.3 was placed on the original glass plate 411, and the lighting voltage of the halogen lamp 410 was so controlled that the light portion potential was 200 V, where A3-size halftone images were formed. Using the images thus formed, any uneven density in lines caused by the wire contamination was observed.

The results obtained in the above evaluation are shown together in Table 23. In Table 23 and the subsequent similar tables, letter symbols denote as follows:

AA: Very well free of uneven density.

A: Well free of uneven density.

B: Uneven density partly occur (no problem in practical use).

C: Uneven density in lines occur over the whole area of images in some cases.

As is seen from the results, even in the 1,000,000 sheets running, all the light-receiving members caused no uneven density in lines due to wire contamination. It has been found from this result that, as for gas species used in the etching, it was possible to maintain the initial cleaning performance when any fluorine type gases are used.

TABLE 21

Conditions for Production of Light-receiving Member

Lower blocking layer

| | |
|---|---|
| $SiH_4$ | 300 SCCM |
| $H_2$ | 500 SCCM |
| NO | 8 SCCM |
| $B_2H_6$ | 2,000 ppm |
| Power | 100 W (13.56 MHz) |
| Internal pressure | 0.4 Torr |
| Layer thickness | 1 μm |

Photoconductive layer

| | |
|---|---|
| $SiH_4$ | 500 SCCM |
| $H_2$ | 500 SCCM |
| Power | 400 W (13.56 MHz) |
| Internal pressure | 0.5 Torr |
| Layer thickness | 20 μm |

TABLE 21-continued

Conditions for Production of Light-receiving Member

Surface layer

| | |
|---|---|
| $CH_4$ | 500 SCCM |
| Power | 1,000 W (105 MHz) |
| Internal pressure | 10 mTorr |
| Layer thickness | 0.3 μm |

TABLE 22

Conditions for Fluorine Treatment

| | |
|---|---|
| $CF_4$ | 400 SCCM |
| Substrate temperature | 250° C. |
| Pressure | 20 mTorr |
| Power | 500 W (105 MHz) |
| Etching depth | 0.05 μm |

TABLE 23

| | Running test (× 10,000 sheets) | | | | | Halftone uneven density | | | | |
|---|---|---|---|---|---|---|---|---|---|---|
| | Initial | 10 | 50 | 80 | 100 | Initial | 10 | 50 | 80 | 100 |
| | Experimental Example 1: | | | | | | | | | |
| $CF_4$ | A | A | A | A | A | AA | AA | AA | AA | AA |
| $CHF_3$ | A | A | A | A | A | AA | AA | AA | AA | AA |
| $ClF_3$ | A | A | A | A | A | AA | AA | AA | AA | AA |

EXPERIMENTAL EXAMPLE 11

Light-receiving members were produced in the same manner as in Experimental Example 10 while repeating the film formation and the etching treatment to form the surface layer in a layer thickness of 3,000 Å in total, except that, in the formation of the surface layer, the deposited films were formed, and etched by fluorine treatment, in the film thickness and the depth, respectively, in five ways as shown in Table 24 below. $CF_4$ gas was used as the fluorine source.

TABLE 24

| Deposited film thickness (Å) | Etching depth (Å) | Light-receiving member |
|---|---|---|
| 520 | 20 | (L) |
| 550 | 50 | (M) |
| 600 | 100 | (N) |
| 1,000 | 500 | (O) |
| 1,500 | 1,000 | (P) |

To evaluate the water repellency of the above five light-receiving members (L) to (P), the contact angles of their surfaces with respect to pure water were measured in the same manner as in Experimental Example 10. As a result, all the light-receiving members showed a contact angle of 100 degrees or greater, having achieved a high water repellency.

Next, these five light-receiving members were running tested in the same manner as in Experimental Example 10 while similarly repeating the steps of charging, exposure, development, transfer, separation and scrape cleaning were repeated in order.

The results obtained in the above evaluation are shown in Table 25.

As is seen from the results, in the 1,000,000 sheets running, all the light-receiving members caused no faulty images such as smeared images and stains at all. After the 1,000,000 sheets running, the contact angle was again measured. As the result, it was 100 degrees or greater in all the light-receiving members, finding that it was possible to maintain the initial water repellency so long as the etching for each time was in a depth of at least 20 Å.

Evaluation was also made on wire contamination of the corona assembly during the running, which was evaluated on the basis of uneven halftone image density in the same manner as in Experimental Example 10. The results obtained in this evaluation are shown in Table 25.

In the 1,000,000 sheets running, all the light-receiving members caused no uneven density in lines due to the wire contamination. It has been found from this result that it was possible to maintain the initial water repellency so long as the etching for each time was in a depth of at least 20 Å.

TABLE 25

|     | Running test (×10,000 sheets) | | | | | Halftone uneven density | | | | |
| --- | --- | --- | --- | --- | --- | --- | --- | --- | --- | --- |
|     | Initial | 10 | 50 | 80 | 100 | Initial | 10 | 50 | 80 | 100 |
| Experimental Example 11: | | | | | | | | | | |
| (L) | A | A | A | A | A | AA | AA | AA | AA | AA |
| (M) | A | A | A | A | A | AA | AA | AA | AA | AA |
| (N) | A | A | A | A | A | AA | AA | AA | AA | AA |
| (O) | A | A | A | A | A | AA | AA | AA | AA | AA |
| (P) | A | A | A | A | A | AA | AA | AA | AA | AA |

EXPERIMENTAL EXAMPLE 12

Light-receiving members were produced in the same manner as in Experimental Example 10 while repeating the film formation and the etching treatment plural times to form the surface layer in a layer thickness of 4,000 Å in total, except that, in the formation of the surface layer, the deposited films were formed, and etched by fluorine treatment, in the film thickness and the depth, respectively, in six ways as shown in Table 26 below. $CF_4$ gas was used as the fluorine source.

TABLE 26

| Deposited film thickness (Å) | Etching depth (Å) | Light-receiving member |
| --- | --- | --- |
| 520 | 500 | (Q) |
| 550 | 500 | (R) |
| 600 | 500 | (S) |
| 1,000 | 500 | (T) |
| 1,500 | 500 | (U) |
| 2,500 | 500 | (V) |

To evaluate the water repellency of the above six light-receiving members (Q) to (V), the contact angles of their surfaces with respect to pure water were measured in the same manner as in Experimental Example 10. As a result, all the light-receiving members showed a contact angle of 100 degrees or greater, having achieved a high water repellency.

Next, these six light-receiving members were running tested in the same manner as in Experimental Example 10 while similarly repeating the steps of charging, exposure, development, transfer, separation and scrape cleaning were repeated in order.

The results obtained in the above evaluation are shown in Table 27.

As is seen from the results, in the 1,000,000 sheets running, all the light-receiving members caused no smeared images at all. After the 1,000,000 sheets running, the contact angle was again measured. As the result, it was 100 degrees or greater in the light-receiving members other than (K), finding that it was possible to maintain the initial water repellency. With regard to the light-receiving member (K), however, the contact angle was 50 degrees after 1,000,000 sheets running. All the light-receiving members caused no faulty images such as stains.

Evaluation was also made on wire contamination of the corona assembly during the running, which was evaluated on the basis of uneven halftone image density in the same manner as in Experimental Example 10. The results obtained in this evaluation are shown in Table 27.

As is seen from the results, in the 1,000,000 sheets running, all the light-receiving members caused no uneven density in lines due to the wire contamination.

It has been found from the foregoing results that the surface layer formed by repeating film formation and etching may preferably have a layer thickness not larger than 2,000 Å for each layer of the deposited films. It has been also found that if the thickness is smaller than 20 Å difficulties may occur such that the film uniformity is damaged or it takes a long time for the film formation.

TABLE 27

|     | Running test (×10,000 sheets) | | | | | Halftone uneven density | | | | |
| --- | --- | --- | --- | --- | --- | --- | --- | --- | --- | --- |
|     | Initial | 10 | 50 | 80 | 100 | Initial | 10 | 50 | 80 | 100 |
| Experimental Example 12: | | | | | | | | | | |
| (Q) | A | A | A | A | A | AA | AA | AA | AA | AA |
| (R) | A | A | A | A | A | AA | AA | AA | AA | AA |
| (S) | A | A | A | A | A | AA | AA | AA | AA | AA |
| (T) | A | A | A | A | A | AA | AA | AA | AA | AA |
| (U) | A | A | A | A | A | AA | AA | AA | AA | AA |
| (V) | A | A | B | B | B | AA | AA | AA | A | A |

EXPERIMENTAL EXAMPLE 13

Light-receiving members were produced in the same manner as in Experimental Example 10 while repeating the film formation and the etching treatment to form the surface layer in a layer thickness of 4,000 Å in total, except that the surface layer was formed using a high-frequency power of 13.56 MHz under conditions as shown in Table 28 below and the deposited films of the surface layer were formed, and etched by fluorine treatment, in the film thickness and the depth, respectively, in six ways as shown in Table 29 below. $CF_4$ gas was used as the fluorine source.

TABLE 28

| Surface layer | |
| --- | --- |
| $CH_4$ | 500 SCCM |
| Power | 1,000 W (13.56 MHz) |
| Internal pressure | 0.4 Torr |
| Etching conditions | |
| $CF_4$ | 200 SCCM |
| Power | 500 W (13.56 MHz) |
| Internal pressure | 0.4 Torr |

TABLE 29

| Deposited film thickness (Å) | Etching depth (Å) | Light-receiving member |
|---|---|---|
| 520 | 500 | (Q') |
| 550 | 500 | (R') |
| 600 | 500 | (S') |
| 1,000 | 500 | (T') |
| 1,500 | 500 | (U') |
| 2,500 | 500 | (V') |

To evaluate the water repellency of the above six light-receiving members (Q') to (V'), the contact angles of their surfaces with respect to pure water were measured in the same manner as in Experimental Example 10. As a result, all the light-receiving members showed a contact angle of 100 degrees or greater, having achieved a high water repellency.

Next, these six light-receiving members were running tested in the same manner as in Experimental Example 10 while similarly repeating the steps of charging, exposure, development, transfer, separation and scrape cleaning were repeated in order.

The results obtained in the above evaluation are shown in Table 30.

As is seen from the results, in the 1,000,000 i sheets running, all the light-receiving members caused no smeared images at all. After the 1,000,000 sheets running, the contact angle was again measured. As the result, it was 100 degrees or greater in the light-receiving members other than (K'), finding that it was possible to maintain the initial water repellency. With regard to the light-receiving member (K), however, the contact angle was 50 degrees after 1,000,000 sheets running. All the light-receiving members caused no faulty images such as stains.

Evaluation was also made on wire contamination of the corona assembly during the running, which was evaluated on the basis of uneven halftone image density in the same manner as in Experimental Example 10. The results obtained in this evaluation are shown in Table 30.

As is seen from the results, in the 1,000,000 sheets running, all the light-receiving members caused uneven density in lines due to the wire contamination, but on the level of no problem in practical use.

TABLE 30

| | Running test (×10,000 sheets) | | | | | Halftone uneven density | | | | |
|---|---|---|---|---|---|---|---|---|---|---|
| | Initial | 10 | 50 | 80 | 100 | Initial | 10 | 50 | 80 | 100 |
| Experimental Example 13: | | | | | | | | | | |
| (Q') | A | A | A | A | A | A | A | A | A | A |
| (R') | A | A | A | A | A | A | A | A | A | A |
| (S') | A | A | A | A | A | A | A | A | A | A |
| (T') | A | A | A | A | A | A | A | A | A | A |
| (U') | A | A | A | A | A | A | A | A | A | A |
| (V') | A | A | B | B | B | A | A | A | B | B |

EXPERIMENTAL EXAMPLE 14

Using the plasma-assisted CVD apparatus shown in FIG. 2, light-receiving members were produced in the same manner as in Experimental Example 10, forming the surface layer containing fluorine atoms while carrying out the film formation and the etching treatment under conditions in six ways as shown in Table 31 below, using $CF_4$ gas as the fluorine source.

TABLE 31

| Deposited film thickness (Å) | Etching depth (Å) | Surface layer thickness (Å) | Light-receiving member |
|---|---|---|---|
| 1,000 | 500 | 1,000 | (X1) |
| 1,000 | 500 | 2,000 | (X2) |
| 1,000 | 500 | 3,000 | (X3) |
| 1,000 | 500 | 4,000 | (X4) |

To evaluate the water repellency of the above five light-receiving members (X1) to (X4), the contact angles of their surfaces with respect to pure water were measured in the same manner as in Experimental Example 10. As a result, all the light-receiving members showed a contact angle of 100 degrees or greater, having achieved a high water repellency.

Next, these four light-receiving members were running tested in the same manner as in Experimental Example 10 while similarly repeating the steps of charging, exposure, development, transfer, separation and scrape cleaning were repeated in order.

The results obtained in the above evaluation are shown in Table 32.

In the 1,000,000 sheets running, all the light-receiving members caused no faulty images such as smeared images and stains at all. As is seen from the results, the effect of the present invention can be obtained when the operation of the film formation and the etching treatment are carried out repeatedly at least twice.

Evaluation was also made on wire contamination of the corona assembly during the running, which was evaluated on the basis of uneven halftone image density in the same manner as in Experimental Example 10. The results obtained in this evaluation are shown in Table 32. As is seen from the results, in the 1,000,000 sheets running, all the light-receiving members caused no uneven density in lines due to wire contamination.

TABLE 32

| | Running test (×10,000 sheets) | | | | | Halftone uneven density | | | | |
|---|---|---|---|---|---|---|---|---|---|---|
| | Initial | 10 | 50 | 80 | 100 | Initial | 10 | 50 | 80 | 100 |
| Experimental Example 14: | | | | | | | | | | |
| (X1) | A | A | A | A | A | AA | AA | AA | AA | AA |
| (X2) | A | A | A | A | A | AA | AA | AA | AA | AA |
| (X3) | A | A | A | A | A | AA | AA | AA | AA | AA |
| (X4) | A | A | A | A | A | AA | AA | AA | AA | AA |

EXPERIMENTAL EXAMPLE 15

A light-receiving member was produced using the plasma-assisted CVD apparatus shown in FIG. 2, under conditions as shown in Table 33. In the formation of the surface layer, the deposited films were formed in a film thickness of 1,000 Å for each time. The deposited films thus formed were each subjected to fluorine treatment under conditions as shown in Table 22 to carry out etching in a depth of 500 Å, to thereby form a surface layer containing fluorine atoms, and having a layer thickness of 3,000 Å in total.

To evaluate the water repellency of the above light-receiving member, the contact angle of its surface with respect to pure water was measured in the same manner as in Experimental Example 10. As a result, the light-receiving member showed a contact angle of 100 degrees or greater, having achieved a high water repellency.

Next, this light-receiving member was running tested in the same manner as in Experimental Example 10.

The results obtained in the above evaluation are shown in Table 34. As is seen from the results, in the 1,000,000 sheets running, the light-receiving member caused no faulty images such as smeared images and stains at all.

Evaluation was also made on wire contamination of the corona assembly during the running, which was evaluated on the basis of uneven halftone image density in the same manner as in Experimental Example 10. The results obtained in this evaluation are shown in Table 34. As is seen from the results, in the 1,000,000 sheets running, the light-receiving member caused no uneven density in lines due to the wire contamination.

It has been found from the foregoing results that the present invention can be effective under any layer configuration and discharge frequencies except for those in the surface layer.

TABLE 33

Conditions for Production of Light-receiving Member

Lower blocking layer

| | |
|---|---|
| $SiH_4$ | 300 SCCM |
| $H_2$ | 500 SCCM |
| $B_2H_6$ | 2,000 ppm |
| Power | 100 W (13.56 MHz) |
| Internal pressure | 0.4 Torr |
| Layer thickness | 1 μm |

Charge transport layer

| | |
|---|---|
| $SiH_4$ | 500 SCCM |
| $H_2$ | 500 SCCM |
| $CH_4$ | 50 SCCM |
| Power | 300 W (13.56 MHz) |
| Internal pressure | 0.6 Torr |
| Layer thickness | 15 μm |

Charge generation layer

| | |
|---|---|
| $SiH_4$ | 500 SCCM |
| $H_2$ | 500 SCCM |
| Power | 300 W (13.56 MHz) |
| Internal pressure | 0.5 Torr |
| Layer thickness | 5 μm |

Surface layer

| | |
|---|---|
| $CH_4$ | 500 SCCM |
| Power | 1,000 W (105 MHz) |
| Internal pressure | 15 mTorr |
| Layer thickness | 0.3 μm |

TABLE 34

| Running test (× 10,000 sheets) | | | | | Halftone uneven density | | | | |
|---|---|---|---|---|---|---|---|---|---|
| Initial | 10 | 50 | 80 | 100 | Initial | 10 | 50 | 80 | 100 |
| Experimental Example 15: | | | | | | | | | |
| A | A | A | A | A | AA | AA | AA | AA | AA |

EXPERIMENTAL EXAMPLE 16

A light-receiving member was produced using the plasma-assisted CVD apparatus shown in FIGS. 5 to 7, under conditions as shown in Table 21. In the formation of the surface layer, the deposited films were formed in a film thickness of 1,000 Å for each time. The deposited films thus formed were each subjected to fluorine treatment under conditions as shown in Table 22 to carry out etching in a depth of 500 Å, to thereby form a surface layer containing fluorine atoms and having a layer thickness of 3,000 Å in total.

To evaluate the water repellency of the above light-receiving member, the contact angle of its surface with respect to pure water was measured in the same manner as in Experimental Example 10. As a result, the light-receiving member showed a contact angle of 100 degrees or greater, having achieved a high water repellency.

Next, this light-receiving member was running tested in the same manner as in Experimental Example 10.

The results obtained in the above evaluation are shown in Table 35. As is seen from the results, in the 1,000,000 sheets running, the light-receiving member caused no faulty images such as smeared images and stains at all.

Evaluation was also made on wire contamination of the corona assembly during the running, which was evaluated on the basis of uneven halftone image density in the same manner as in Experimental Example 10. The results obtained in this evaluation are shown in Table 35. As is seen from the results, in the 1,000,000 sheets running, the light-receiving member caused no uneven density in lines due to the wire contamination.

It has been found from the foregoing results that the production process of the present invention can bring about good results when the light-receiving member is produced using apparatus having any construction.

TABLE 35

| Running test (× 10,000 sheets) | | | | | Halftone uneven density | | | | |
|---|---|---|---|---|---|---|---|---|---|
| Initial | 10 | 50 | 80 | 100 | Initial | 10 | 50 | 80 | 100 |
| Experimental Example 16: | | | | | | | | | |
| A | A | A | A | A | AA | AA | AA | AA | AA |

EXPERIMENTAL EXAMPLE 17

Light-receiving members were produced using the plasma-assisted CVD apparatus shown in FIG. 2. The lower blocking layer and photoconductive layer were formed under conditions as shown in Table 36. At the time it was completed to form films up to the photoconductive layer, its surface was etched under conditions as shown in Table 37, and thereafter the film formation and etching to form the surface layer were carried out twice under conditions as shown in Tables 38 and 37, respectively. Thus, the surface layer of the present invention was formed. In the formation of this surface layer, the deposited films were each formed in a film thickness of 1,000 Å and etched in a depth of 200 Å so as to be in a layer thickness of 1,600 Å in total.

To evaluate the water repellency of the above light-receiving member, the contact angle of its surface with respect to pure water was measured in the same manner as in Experimental Example 10. As a result, the light-receiving member showed a contact angle of 100 degrees or greater, having achieved a high water repellency.

Next, this light-receiving member was running tested in the same manner as in Experimental Example 10.

The results obtained in the above evaluation are shown in Table 39. As is seen from the results, in the 1,000,000 sheets running, the light-receiving member caused no faulty images such as smeared images and stains at all.

Evaluation was also made on wire contamination of the corona assembly during the running, which was evaluated on the basis of uneven halftone image density in the same manner as in Experimental Example 10. The results obtained in this evaluation are shown in Table 39. As is seen from the results, in the 1,000,000 sheets running, the light-receiving member caused no uneven density in lines due to the wire contamination.

TABLE 36

Conditions for Production of Light-receiving Member

Lower blocking layer

| | |
|---|---|
| $SiH_4$ | 100 SCCM |
| $H_2$ | 500 SCCM |
| NO | 5 SCCM |
| $B_2H_6$ | 1,500 ppm |
| Power | 100 W (13.56 MHz) |
| Internal pressure | 0.5 Torr |
| Substrate temperature | 250° C. |
| Layer thickness | 2 μm |

Photoconductive layer

| | |
|---|---|
| $SiH_4$ | 300 SCCM |
| $H_2$ | 500 SCCM |
| Power | 400 W (13.56 MHz) |
| Internal pressure | 0.5 Torr |
| Substrate temperature | 250° C. |
| Layer thickness | 20 μm |

TABLE 37

Conditions for Fluorine Treatment

| | |
|---|---|
| $CF_4$ | 300 SCCM |
| Substrate temperature | 250° C. |
| Pressure | 20 mTorr |
| Power | 500 W (105 MHz) |
| Etching depth | 0.02 μm |

TABLE 38

Conditions for Surface Layer Formation

Surface layer

| | |
|---|---|
| $CH_4$ | 500 SCCM |
| Power | 1,500 W (105 MHz) |
| Internal pressure | 20 mTorr |
| Substrate temperature | 250° C. |
| Layer thickness | 0.1 μm |

TABLE 39

| Running test (× 10,000 sheets) | | | | | Halftone uneven density | | | | |
|---|---|---|---|---|---|---|---|---|---|
| Initial | 10 | 50 | 80 | 100 | Initial | 10 | 50 | 80 | 100 |
| Experimental Example 17: | | | | | | | | | |
| A | A | A | A | A | AA | AA | AA | AA | AA |

EXPERIMENTAL EXAMPLE 18

Light-receiving members were produced using the plasma-assisted CVD apparatus shown in FIG. 2. The lower blocking layer, photoconductive layer and surface layer were formed under conditions as shown in Table 40. In the present Experimental Example, the process of film formation and etching to form the surface layer was carried out five times, and the surface layer film forming conditions in each process were varied as shown in Table 40. The deposited films were etched under conditions as shown in Table 41.

To evaluate the water repellency of the above light-receiving member, the contact angle of its surface with respect to pure water was measured in the same manner as in Experimental Example 10. As a result, the light-receiving member showed a contact angle of 100 degrees or greater, having achieved a high water repellency.

Next, this light-receiving member was running tested in the same manner as in Experimental Example 10.

The results obtained in the above evaluation are shown in Table 42. As is seen from the results, in the 1,000,000 sheets running, the light-receiving member caused no faulty images such as smeared images and stains at all.

Evaluation was also made on wire contamination of the corona assembly during the running, which was evaluated on the basis of uneven halftone image density in the same manner as in Experimental Example 10. The results obtained in this evaluation are shown in Table 42. As is seen from the results, in the 1,000,000 sheets running, the light-receiving member caused no uneven density in lines due to wire contamination.

TABLE 40

Conditions for Production of Light-receiving Member

Lower blocking layer

| | |
|---|---|
| $SiH_4$ | 100 SCCM |
| $H_2$ | 500 SCCM |
| NO | 5 SCCM |
| $B_2H_6$ | 500 ppm |
| Power | 100 W (13.56 MHz) |
| Internal pressure | 0.5 Torr |
| Substrate temperature | 200° C. |
| Layer thickness | 2 μm |

Photoconductive layer

| | |
|---|---|
| $SiH_4$ | 300 SCCM |
| $H_2$ | 500 SCCM |
| Power | 400 W (13.56 MHz) |
| Internal pressure | 0.5 Torr |
| Substrate temperature | 200° C. |
| Layer thickness | 20 μm |

Surface layer

| | |
|---|---|
| (1st layer) $SiH_4$ | 40 SCCM → 30 SCCM |
| (2nd layer) $SiH_4$ | 30 SCCM → 20 SCCM |
| (3rd layer) $SiH_4$ | 20 SCCM → 10 SCCM |
| (4th layer) $SiH_4$ | 10 SCCM → 0 SCCM |
| (5th layer) $SiH_4$ | 0 SCCM |

Common conditions:

| | |
|---|---|
| $CH_4$ | 500 SCCM |
| Power | 100 W (105 MHz) |
| Internal pressure | 20 mTorr |
| Substrate temperature | 200° C. |
| Layer thickness | 0.1 μm |

TABLE 41

| Conditions for Fluorine Treatment | |
| --- | --- |
| $CF_4$ | 400 SCCM |
| Substrate temperature | 200° C. |
| Pressure | 20 mTorr |
| Power | 600 W (105 MHz) |
| Etching depth | 0.05 μm |

TABLE 42

| Running test (× 10,000 sheets) | | | | | Halftone uneven density | | | | |
| --- | --- | --- | --- | --- | --- | --- | --- | --- | --- |
| Initial | 10 | 50 | 80 | 100 | Initial | 10 | 50 | 80 | 100 |
| Experimental Example 18: | | | | | | | | | |
| A | A | A | A | A | AA | AA | AA | AA | AA |

EXPERIMENTAL EXAMPLE 19

A lower blocking layer (a charge injection blocking layer) and a photoconductive layer were formed as the receiving layer under conditions as shown in Table 1, and thereafter the surface of the photoconductive layer was subjected to fluorine treatment under conditions as shown in Table 22. Subsequently, a surface layer was formed thereon in a thickness of 0.3 μm under conditions as shown in Table 21, and thereafter its surface was further subjected to fluorine treatment under conditions as shown in Table 22. As a result, like Experimental Example 10, a light-receiving member having superior performances were obtained.

EXPERIMENTAL EXAMPLE 20

A lower blocking layer and a photoconductive layer were formed as the receiving layer under conditions as shown in Table 1. Thereafter, a 0.3 μm thick a-SiC layer was formed thereon under the surface layer forming conditions as shown in Table 1, and the surface of the a-SiC layer was subjected to fluorine treatment under conditions as shown in Table 2. Subsequently, a layer was formed on the fluorine-treated a-SiC layer in a thickness of 1,000 Å under the surface layer forming conditions as shown in Table 21, and thereafter its surface was further subjected to fluorine treatment under conditions as shown in Table 22. The light-receiving member thus obtained was, like Experimental Example 10, a light-receiving member having superior performances.

EXPERIMENTAL EXAMPLE 21

A lower blocking layer and a photoconductive layer were formed under conditions as shown in Table 43. Thereafter, a deposited film was formed thereon under the surface layer forming conditions as shown in Table 43, and the deposited film thus formed was subjected to fluorine treatment under conditions as shown in Table 44 to carry out etching in a depth of 500 Å. Subsequently, the operation to form another deposited film constituting the surface layer, being formed in a thickness of 1,000 Å for each deposition, and to again make the fluorine treatment under conditions as shown in Table 44 to carry out etching in a depth of 500 Å, was repeated. This film formation and etching for the surface layer were repeated plural times so as. to provide a layer thickness of 3,000 Å in total to form a surface layer containing fluorine atoms.

The light-receiving member thus obtained was running tested in the same manner as in Experimental Example 1.

As the result, in the 1,000,000 sheets running, the light-receiving member caused no faulty images such as smeared images and stains at all.

It has been found from the foregoing results that the present invention can be effective also when the light-receiving member has a layer configuration where a-C (amorphous carbon) is used in the surface layer.

TABLE 43

| Conditions for Production of Light-receiving Member | |
| --- | --- |
| Lower blocking layer | |
| $SiH_4$ | 300 SCCM |
| $H_2$ | 500 SCCM |
| NO | 8 SCCM |
| $B_2H_6$ | 2,000 ppm |
| Power | 100 W |
| Internal pressure | 0.4 Torr |
| Layer thickness | 1 μm |
| Photoconductive layer | |
| $SiH_4$ | 500 SCCM |
| $H_2$ | 500 SCCM |
| Power | 400 W |
| Internal pressure | 0.5 Torr |
| Layer thickness | 20 μm |
| Surface layer | |
| $CH_4$ | 600 SCCM |
| Power | 1,000 W |
| Internal pressure | 0.4 Torr |
| Layer thickness | 0.1 μm |

TABLE 44

| Conditions for Fluorine Treatment | |
| --- | --- |
| $CF_4$ | 500 SCCM |
| Substrate temperature | 250° C. |
| Pressure | 0.6 Torr |
| Power | 500 W |
| Etching depth | 0.05 μm |

EXPERIMENTAL EXAMPLE 22

A lower blocking layer and a photoconductive layer were formed under conditions as shown in Table 43. Thereafter, a surface layer was formed under conditions as shown in Table 45A. In this surface layer formation, the deposited films were formed in a film thickness of 1,000 Å for each time. Each deposited film thus formed was subjected to fluorine treatment under conditions as shown in Table 44 to carry out etching in a depth of 500 Å. Subsequently, the operation to form another deposited film in a thickness of 1,000 Å and to again make the fluorine treatment under conditions as shown in Table 44 to carry out etching in a depth of 500 Å, was repeated. This film formation and etching for the surface layer were repeated plural times so as to provide a layer thickness of 3,000 Å in total to form a surface layer containing fluorine atoms.

As fluorine sources, $CF_4$, $CHF_3$ and $ClF_3$ were respectively used so that corresponding three light-receiving members were produced.

All the light-receiving members had a high contact angle of 100 degrees or greater. These were running tested in the same manner as in Experimental Example 1. As the result, in the 1,000,000 sheets running, all the light-receiving members caused no faulty images such as smeared images and stains at all even in the case of N-containing surface layers. After the 1,000,000 sheets running, the contact angle was again measured. As the result, it was 75 degrees or greater in all the light-receiving members.

TABLE 45A

Conditions for Surface Layer Formation

| Surface layer | |
| --- | --- |
| SiH$_4$ | 50 SCCM |
| N2 | 900 SCCM |
| Power | 100 W |
| Internal pressure | 0.4 Torr |
| Layer thickness | 0.3 μm |

EXPERIMENTAL EXAMPLE 23

A lower blocking layer, a photoconductive layer and a surface layer were formed in order, under conditions as shown in Table 43. Here, the deposited film constituting the surface layer was formed at one time in a layer thickness of 3,500 Å. The surface layer, thus formed, was subjected to etching by fluorine treatment on only the outermost surface under conditions as shown in Table 44, to carry out etching in a depth of 500 Å to form the surface layer in a layer thickness of 3,000 Å.

As fluorine sources, CF$_4$, CHF$_3$ and ClF$_3$ were respectively used so that three light-receiving members were produced.

To evaluate the water repellency of the above three light-receiving members, the contact angles of their surfaces with respect to pure water were measured. As a result, all the light-receiving members showed a contact angle of 100 degrees or greater, having achieved a high water repellency.

These light-receiving members were running tested in the same manner as in Experimental Example 1. As the result, in the 1,000,000 sheets running, all the light-receiving members caused smeared images on the 500,000th sheet and thereafter in some cases.

After the 1,000,000 sheets running, the contact angle of each light-receiving member was again measured. As the result, it was at the value of 50 degrees or less in all the light-receiving members.

EXPERIMENTAL EXAMPLE 24

Light-receiving members were produced in the same manner as in Experimental Example 22 while repeating the film formation and etching to form the surface layer in a layer thickness of 3,000 Å in total, except that, in the formation of the surface layer, the deposited films were formed, and etched by fluorine treatment, in the layer thickness and the depth, respectively, in five ways as shown in Table 45B below. CF$_4$ gas was used as the fluorine source.

TABLE 45B

| Thickness of film formed by each deposition (Å) | Depth of film etched for each time (Å) |
| --- | --- |
| 520 | 20 |
| 550 | 50 |
| 600 | 100 |

TABLE 45B-continued

| Thickness of film formed by each deposition (Å) | Depth of film etched for each time (Å) |
| --- | --- |
| 1,000 | 500 |
| 1,500 | 1,000 |

The contact angles of the surfaces of the light-receiving members thus formed were measured. As a result, all the light-receiving members showed a contact angle of 100 degrees or greater, having achieved a high water repellency.

These light-receiving members were also running tested in the same manner as in Experimental Example 1.

As the result, in the 1,000,000 sheets running, all the light-receiving members caused no faulty images such as smeared images and stains at all. After the 1,000,000 sheets running, the contact angle was again measured.

As the result, it was 100 degrees or greater in all the light-receiving members, finding that it was possible to maintain the initial water repellency so long as the etching for each time was in a depth of at least 20 Å.

EXPERIMENTAL EXAMPLE 25

Light-receiving members were produced in the same manner as in Experimental Example 22 while repeating the film formation and etching to form the surface layer in a layer thickness of 4,000 Å in total, except that, in the formation of the surface layer, the deposited films were formed, and etched by fluorine treatment, in the layer thickness and the depth, respectively, in six ways as shown in Table 46 below. CF$_4$ gas was used as the fluorine source.

TABLE 46

| Thickness of film formed by each deposition (Å) | Depth of film etched for each time (Å) |
| --- | --- |
| 520 | 500 |
| 550 | 500 |
| 600 | 500 |
| 1,000 | 500 |
| 1,500 | 500 |
| 2,500 | 500 |

The contact angles of the surfaces of the light-receiving members thus formed were measured. As a result, all the light-receiving members showed a contact angle of 100 degrees or greater, having achieved a high water repellency.

These light-receiving members were running tested in the same manner as in Experimental Example 1. As the result, in the 1,000,000 sheets running, the light-receiving members other than the one in which the deposited film was in a layer thickness of 2,500 Å for each time caused no smeared images at all. After the 1,000,000 sheets running, the contact angle was again measured. As the result, it was 100 degrees or greater in the light-receiving members other than the above 2,500 Å-deposited one, finding that except for the latter it was possible to maintain the initial water repellency. With regard to the latter light-receiving member, it partly caused smeared images in some cases on the 500,000th sheet and thereafter, and had a contact angle of 50 degrees after the 1,000,000 sheets running. All the light-receiving members cause no faulty images such as stains.

It has been found from the foregoing results that the surface layer formed by repeating film formation and etch-

EXPERIMENTAL EXAMPLE 26

A lower blocking layer, a photoconductive layer and a surface layer were formed in order, in the same manner as in Experimental Example 22, except that in the formation of the surface layer the deposited films constituting the surface layer were formed in a film thickness of 1,000 Å for each time. Each deposited film thus formed was subjected to fluorine treatment under conditions as shown in Table 44 to carry out etching in a depth of 500 Å. Subsequently, the operation to form another deposited film in a thickness of 1,000 Å and to again make the fluorine treatment under conditions as shown in Table 44 to carry out etching in a depth of 500 Å, was repeated. This film formation and etching for the surface layer-were repeated plural times so as to provide a layer thickness of 1,000 Å, 2,000 Å, 3,000 Å or 4,000 Å in total to form a surface layer containing fluorine atoms.

The contact angles of the surfaces of the light-receiving members thus formed were measured. As a result, all the light-receiving members showed a contact angle of 100 degrees or greater, having achieved a high water repellency.

These light-receiving members were running tested in the same manner as in Experimental Example 1. As the result, in the 1,000,000 sheets running, all the light-receiving members caused no faulty images such as smeared images and stains at all.

EXPERIMENTAL EXAMPLE 27

A lower blocking layer, a photoconductive layer and a surface layer were formed in order, under conditions as shown in Table 47. Here, in the formation of the surface layer, the deposited films constituting the surface layer of a light-receiving member were formed in a film thickness of 1,000 Å for each time. The deposited film thus formed was subjected to fluorine treatment under conditions as shown in Table 44 to carry out etching in a depth of 500 Å. Subsequently, the operation to form another deposited film in a thickness of 1,000 Å and to again make the fluorine treatment under conditions as shown in Table 44 to carry out etching in a depth of 500 Å, was repeated. This film formation and etching for the surface layer were repeated plural times so as to provide a layer thickness of 3,000 Å in total to form a surface layer containing fluorine atoms.

The contact angle of the surface of the light-receiving member thus formed was measured. As a result, it showed a contact angle of 100 degrees or greater, having achieved a high water repellency.

Next, this light-receiving member was running tested in the same manner as in Experimental Example 1 to find that it similarly had superior performances.

TABLE 47

Conditions for Production of Light-receiving Member

Lower blocking layer

| | |
|---|---|
| $SiH_4$ | 300 SCCM |
| $H_2$ | 500 SCCM |
| $B_2H_6$ | 2,000 ppm |
| Power | 100 w |
| Internal pressure | 0.4 Torr |
| Layer thickness | 1 μm |

TABLE 47-continued

Conditions for Production of Light-receiving Member

Charge transport layer

| | |
|---|---|
| $SiH_4$ | 500 SCCM |
| $H_2$ | 500 SCCM |
| $CH_4$ | 50 SCCM |
| Power | 300 W |
| Internal pressure | 0.5 Torr |
| Layer thickness | 15 μm |

Charge generation layer

| | |
|---|---|
| $SiH_4$ | 500 SCCM |
| $H_2$ | 500 SCCM |
| Power | 300 W |
| Internal pressure | 0.5 Torr |
| Layer thickness | 5 μm |

Surface layer

| | |
|---|---|
| $SiH_4$ | 50 SCCM |
| N2 | 900 SCCM |
| Power | 100 W |
| Internal pressure | 0.4 Torr |
| Layer thickness | 0.3 μm |

EXPERIMENTAL EXAMPLE 28

A lower blocking layer and a photoconductive layer were formed in the same manner as in Experimental Example 21. Thereafter, a surface layer was formed under conditions as shown in Table 48. In this surface layer formation, the deposited films constituting the surface layer were formed in a film thickness of 1,000 Å for each time. The deposited film thus formed was subjected to fluorine treatment under conditions as shown in Table 44 to carry out etching in a depth of 500 Å. Subsequently, the operation to form another deposited film in a thickness of 1,000 Å and to again make the fluorine treatment under conditions as shown in Table 44 to carry out etching in a depth of 500 Å, was repeated. This film formation and etching for the surface layer were repeated plural times so as to provide a layer thickness of 3,000 Å in total to form a surface layer containing fluorine atoms.

The contact angle of the surface of the light-receiving member thus formed was measured. As a result, it showed a contact angle of 100 degrees or greater, having achieved a high water repellency.

This light-receiving member was running tested in the same manner as in Experimental Example 1 to find that it similarly had superior performances.

It has been found from the foregoing results that the present invention can be effective also when the surface layer is a layer containing O (oxygen).

TABLE 48

Conditions for Surface Layer Formation

Surface layer

| | |
|---|---|
| $SiH_4$ | 50 SCCM |
| NO | 900 SCCM |
| Power | 100 W |
| Internal pressure | 0.4 Torr |
| Layer thickness | 0.1 μm |

EXPERIMENTAL EXAMPLE 29

A lower blocking layer and a photoconductive layer were formed in the same manner as in Experimental Example 20.

Thereafter, a surface layer was formed under conditions as shown in Table 49. In this surface layer formation, the deposited films constituting the surface layer were formed in a layer thickness of 1,000 Å for each time. The deposited film thus formed was subjected to fluorine treatment under conditions as shown in Table 44 to carry out etching in a depth of 500 Å. Subsequently, the operation to form another deposited film in a thickness of 1,000 Å and to again make the fluorine treatment under conditions as shown in Table 44 to carry out etching in a depth of 500 Å, was repeated. This film formation and etching for the surface layer were repeated plural times so as to provide a layer thickness of 3,000 Å in total to form a surface layer containing fluorine atoms.

The contact angle of the surface of the light-receiving member thus formed was measured. As a result, it showed a contact angle of 100 degrees or greater, having achieved a high water repellency.

This light-receiving member was running tested in the same manner as in Experimental Example 1 to find that it similarly had superior performances.

It has been found from the foregoing results that the present invention can be effective also when the light-receiving member has a layer configuration where a-BN (amorphous boron nitride) is used in the surface layer.

TABLE 49

Conditions for Surface Layer Formation

Surface layer

| | |
|---|---|
| $B_2H_6$ | 300 SCCM |
| N2 | 600 SCCM |
| Power | 100 W |
| Internal pressure | 0.4 Torr |
| Layer thickness | 0.1 μm |

Effect of the invention:

As having been described above in detail, in the present invention the surface layer of the light-receiving member is formed by repeating plural times film formation and etching using a fluorine type gas. Hence, fluorine atoms are effectively incorporated into the surface layer. When this is used in electrophotographic apparatus, it is possible to well prevent the corona discharge products from adhering even if the steps of charging, exposure, development, transfer, separation and cleaning are repeated. Also, the hardness required as a surface protective layer is by no means damaged, and hence the surface layer can maintain the water repellency even if the outermost surface of the light-receiving member has abraded as a result of long-term repetition of scrape cleaning by means of a blade, and can be substantially free from the changes in moisture adsorption that are caused by differences in environment. Thus, it has become possible to prevent smeared images and faint images from occurring even if no heating means for the light-receiving member is provided. Moreover, the light-receiving member can have a superior cleaning performance, and can maintain the cleaning performance even when the copying process is repeated many times. Thus, it has become possible to prevent uneven image density due to the wire contamination of the corona assembly, caused by the scatter of toner. In addition, since the heating of the light-receiving member is unnecessary, the types of usable toners can be greatly broadened.

Needless to say, the present invention allows appropriate modification and combination within the range of the gist of the invention, and is by no means limited to the embodiments described above.

What is claimed is:

1. A light-receiving member comprising:

a light-receiving layer comprising a non-single-crystalline material containing silicon atoms or germanium atoms; and a surface layer produced by the process which comprises forming on the light-receiving layer a layer of a non-single-crystalline material containing silicon atoms and at least one kind of carbon atoms, oxygen atoms or nitrogen atoms, and etching the entire surface of the layer with an etchant, wherein the formation and the etching are alternately repeated plural times to form a surface layer on a substrate in a reactor capable of reducing an internal pressure thereof, wherein the surface layer has incorporated therein an element of the etchant with a content of the incorporated etchant element varying in a thickness direction of the surface layer to provide a region having a larger content of the etchant element between regions having a small content of the etchant element.

2. A light-receiving member produced by the process which comprises the steps of:

(a) etching a light-receiving layer on a substrate to remove a portion of the light-receiving layer;

(b) forming on the surface of the light-receiving layer an outer layer, said outer layer comprising (i) a non-single-crystalline material containing silicon atoms and at least one kind of carbon atoms, oxygen atoms or nitrogen atoms; or (ii) a non-single-crystalline material containing carbon atoms; and (c) etching the surface of the outer layer with an etchant so as to remove a portion of the outer layer to form a surface layer, wherein the surface layer has incorporated therein an element of the etchant with a content of the incorporated etchant element varying in a thickness direction of the surface layer to provide a region having a larger content of the etchant element between regions having a smaller content of the etchant element.

3. A light-receiving member produced by the process comprising the steps of:

(a) forming an outer layer on the surface of a light-receiving layer, said light-receiving layer supported by a substrate, said outer layer comprising a non-single-crystalline material containing silicon atoms and at least one kind of carbon atoms, oxygen atoms or nitrogen atoms;

(b) etching the surface of the outer layer with an etchant so as to remove a portion of the outer layer;

(c) forming a second outer layer of a non-single crystalline material containing silicon atoms and at least one kind of carbon atoms, oxygen atoms or nitrogen atoms on the surface of the remaining outer layer after the step (b) is conducted; and (d) etching the surface of the second outer layer formed in the step (c) with the etchant, to form a surface layer on the light-receiving layer, wherein the surface layer has incorporated therein an element of the etchant with a content of the incorporated etchant element varying in a thickness direction of the surface layer to provide a region having a larger content of the etchant element between regions having a smaller content of the etchant element.

4. A light-receiving member produced by the process comprising the steps of:

(a) forming an outer layer on the surface of a light-receiving layer, said light-receiving layer supported by a substrate, said outer layer comprising a non-single-crystalline material containing carbon atoms;

(b) etching the surface of the outer layer with an etchant so as to remove a portion of the outer layer;

(c) forming a second outer layer of a non-single-crystalline material containing carbon atoms on the surface of the remaining outer layer after the step (b) is conducted; and (d) etching the surface of the second outer layer formed in the step (c) with the etchant, to form a surface layer on the light-receiving layer, wherein the surface layer has incorporated therein an element of the etchant with a content of the incorporated etchant element varying in a thickness direction of the surface layer to provide a region having a larger content of the etchant element between regions having a smaller content of the etchant element.

5. A light-receiving member produced by the process comprising the steps of:

(a) forming an outer layer on the surface of a light-receiving layer, said light-receiving layer supported by a substrate, said outer layer comprising a non-single-crystalline material containing boron atoms and nitrogen atoms;

(b) etching the surface of the outer layer with an etchant so as to remove a portion of the outer layer;

(c) forming a second outer layer of a non-single-crystalline material containing boron atoms and nitrogen atoms on the surface of the remaining outer layer after the step (b) is conducted; and (d) etching the surface of the second outer layer formed in the step (c) with the etchant, to form a surface layer on the light-receiving layer, wherein the surface layer has incorporated therein an element of the etchant with a content of the incorporated etchant element varying in a thickness direction of the surface layer to provide a region having a larger content of the etchant element between regions having a smaller content of the etchant element.

* * * * *

UNITED STATES PATENT AND TRADEMARK OFFICE
CERTIFICATE OF CORRECTION

PATENT NO. : 6,280,895 B1
DATED : August 28, 2001
INVENTOR(S) : Shigenori Ueda et al.

It is certified that error appears in the above-identified patent and that said Letters Patent is hereby corrected as shown below:

Column 2,
Line 10, ".CVD" should read -- CVD --.

Column 3,
Line 4, "becomes" should read -- become --.

Column 4,
Line 17, "rather" should read -- neither --.

Column 7,
Line 3, "always containing" should read -- contains flourine can always --; and
Line 35, "Outermost" should read -- outermost --.

Column 8,
Line 25, "i s" should read -- is --.

Column 12,
Line 65, "kvpp" should read -- kVpp --.

Column 14,
Line 17, "flat." should read -- flat --; and
Line 47, "surf aces" should read -- surfaces --.

Column 15,
Line 55, "Charging," should read -- charging, --.

Column 17,
Table 4, "Experimental Example 1:" should read -- Experimental Example 2: --.

Column 18,
Line 14, "members" should read -- member --.

Column 25,
Line 30, "member" should read -- members --; and
Line 34, "in" should be deleted.

Column 31,
Line 26, "i" should be deleted.

UNITED STATES PATENT AND TRADEMARK OFFICE
CERTIFICATE OF CORRECTION

PATENT NO.   : 6,280,895 B1
DATED        : August 28, 2001
INVENTOR(S)  : Shigenori Ueda et al.

It is certified that error appears in the above-identified patent and that said Letters Patent is hereby corrected as shown below:

Column 37,
Line 65, "as." should read -- as --.

Column 39,
Table 45A, "N2" should read -- $N_2$ --.

Column 41,
Line 17, "layer-were" should read -- layer were --.

Column 42,
Table 47, "N2" should read -- $N_2$ --.

Signed and Sealed this

Eighteenth Day of June, 2002

Attest:

JAMES E. ROGAN
*Director of the United States Patent and Trademark Office*

*Attesting Officer*